US009001557B2

(12) United States Patent
Kawai et al.

(10) Patent No.: US 9,001,557 B2
(45) Date of Patent: Apr. 7, 2015

(54) VARIABLE RESISTANCE NONVOLATILE MEMORY ELEMENT WRITING METHOD AND VARIABLE RESISTANCE NONVOLATILE MEMORY DEVICE

(71) Applicant: Panasonic Intellectual Property Management Co., Ltd., Osaka (JP)

(72) Inventors: Ken Kawai, Osaka (JP); Kazuhiko Shimakawa, Osaka (JP); Yoshikazu Katoh, Osaka (JP); Yuichiro Ikeda, Hyogo (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 123 days.

(21) Appl. No.: 13/990,209

(22) PCT Filed: Nov. 21, 2012

(86) PCT No.: PCT/JP2012/007501
§ 371 (c)(1),
(2) Date: May 29, 2013

(87) PCT Pub. No.: WO2013/080499
PCT Pub. Date: Jun. 6, 2013

(65) Prior Publication Data
US 2014/0078811 A1    Mar. 20, 2014

(51) Int. Cl.
*G11C 11/00* (2006.01)
*G11C 13/00* (2006.01)

(52) U.S. Cl.
CPC ............ *G11C 13/0069* (2013.01); *G11C 13/00* (2013.01)

(58) Field of Classification Search
USPC ........................ 365/148, 189.14, 189.09, 163
See application file for complete search history.

(56) References Cited

U.S. PATENT DOCUMENTS

| | | | |
|---|---|---|---|
| 7,609,544 B2 | 10/2009 | Osada et al. | |
| 8,022,502 B2 | 9/2011 | Kanzawa et al. | |
| 8,305,795 B2 | 11/2012 | Azuma et al. | |
| 8,338,816 B2 | 12/2012 | Kanzawa et al. | |
| 8,587,986 B2 * | 11/2013 | Kitagawa et al. | 365/148 |
| 2006/0126380 A1 | 6/2006 | Osada et al. | |
| 2009/0283736 A1 | 11/2009 | Kanzawa et al. | |
| 2010/0207094 A1 | 8/2010 | Kanzawa et al. | |
| 2011/0128773 A1 | 6/2011 | Azuma et al. | |
| 2011/0176351 A1 | 7/2011 | Fujitsuka et al. | |
| 2011/0294259 A1 | 12/2011 | Kanzawa et al. | |
| 2012/0069633 A1 | 3/2012 | Katoh | |
| 2013/0003439 A1 | 1/2013 | Azuma et al. | |
| 2013/0044534 A1 | 2/2013 | Kawai et al. | |

FOREIGN PATENT DOCUMENTS

| | | |
|---|---|---|
| JP | 2006-155700 | 6/2006 |
| JP | 2007-4935 | 1/2007 |
| JP | 2011-146111 | 7/2011 |
| WO | 2008/149484 | 12/2008 |
| WO | 2009/050833 | 4/2009 |
| WO | 2010/125805 | 11/2010 |
| WO | 2011/121970 | 10/2011 |
| WO | 2011/121971 | 10/2011 |

* cited by examiner

*Primary Examiner* — David Lam
(74) *Attorney, Agent, or Firm* — Wenderoth, Lind & Ponack, LLP

(57) ABSTRACT

Provided is a method of writing to a variable resistance nonvolatile memory element which is capable of both improving retention characteristics and enlarging a window of operation. In the method of writing, to write "1" data (LR), first a weak HR writing process is performed in which a weak HR writing voltage pulse set for changing the variable resistance nonvolatile memory element to an intermediate resistance state is applied and, subsequently, a LR writing process is performed in which a LR writing voltage pulse set for changing the variable resistance nonvolatile memory element from the intermediate resistance state to a LR state is applied.

10 Claims, 12 Drawing Sheets

FIG. 11

| Mode of operation | LR writing operation | | | | | | HR writing operation | | | |
|---|---|---|---|---|---|---|---|---|---|---|
| | Weak HR writing | | LR writing | | LR verification | HR writing | | HR verification | Reading |
| Node | Negative pulse application | Positive pulse application | Positive pulse application | Negative pulse application | Reading | Negative pulse application | Positive pulse application | Reading | Reading |
| WL | Vw (2.4 V) | Vw (2.4 V) | Vw (2.4 V) | Vw (2.4 V) | VDD (1.8 V) | Vw (2.4 V) | Vw (2.4 V) | VDD (1.8 V) | VDD (1.8 V) |
| SL | Vs (1.7 V) | 0 V | 0 V | Vs (2.4 V) | 0 V | Vs (1.0 V) | 0 V | 0 V | 0 V |
| BL | Vb (1.7 V) / 0 V ⊓ | Vb (1.6 V) / 0 V ⊓ | Vb (1.1 V) / 0 V ⊓ | Vb (2.4 V) / 0 V ⊔ | Vread (0.4 V) | Vb (1.0 V) / 0 V ⊔ | Vb (2.4 V) / 0 V ⊓ | Vread (0.4 V) | Vread (0.4 V) |

VARIABLE RESISTANCE NONVOLATILE MEMORY ELEMENT WRITING METHOD AND VARIABLE RESISTANCE NONVOLATILE MEMORY DEVICE

TECHNICAL FIELD

The present invention relates to methods of writing to variable resistance nonvolatile memory elements whose resistance value changes reversibly based on electrical signals and to variable resistance nonvolatile memory devices.

BACKGROUND ART

Recent years have seen progress in the research and development of variable resistance nonvolatile memory devices (hereinafter also referred to as nonvolatile memory devices) having memory cells which include variable resistance nonvolatile memory elements (hereinafter also referred to as variable resistance elements) as nonvolatile memory devices capable of high-speed operations and suitable for large-capacity storage. Here, a variable resistance element is an element whose resistance value reversibly changes based on an electric signal and, furthermore, is an element that is capable of storing data corresponding to a resistance value in a nonvolatile manner.

A known nonvolatile memory device using variable resistance elements includes an array of memory cells known as 1T1R memory cells organized in a matrix. Each 1T1R memory cell is provided in the vicinity of a cross-point of a bit line and a word line arranged orthogonal to each other and includes a transistor and a variable resistance element connected in series. In a 1T1R memory cell, one terminal of a two-terminal variable resistance element is connected to a bit line or a source line, and the other terminal is connected to the drain or the source of the transistor. The gate of the transistor is connected to a word line. The other terminal of the transistor is connected to a source line that is not connected to the one terminal of the variable resistance element or a bit line. The source line is arranged parallel to the bit line or word line.

Moreover, a known nonvolatile memory device having a different memory cell structure includes an array of cross-point memory cells known as 1D1R memory cells organized in a matrix. Each 1D1R memory cell is provided at a cross-point of a bit line and a word line arranged orthogonal to each other and includes a diode and a variable resistance element connected in series.

Hereinafter, a typical conventional variable resistance element will be described (Patent Literature (PTL) 1).

PTL 1 discloses a variable resistance element including ion conductive variable resistance elements, each of which comprises an insulating film (specifically amorphous $Gd_2O_3$) and a conductive film (specifically CuTe).

FIG. 14 is a schematic diagram of a cross section of the variable resistance element disclosed by PTL 1. A variable resistant element 5 includes a stacked structure of two electrodes 1 and 2 and a conductive film 3 and insulative film 4 interposed between the two electrodes 1 and 2. Here, a metal film, an alloy film (a CuTe alloy film, for example), or a metallic compound film comprising one or more metal element selected from Cu, Ag, Zn are disclosed as examples of material used for the conductive film 3. Moreover, an insulator such as amorphous $Gd_2O_3$ or $SiO_2$ is disclosed as material for the insulative film 4.

Next, writing to the variable resistance element 5 shown in FIG. 14 will be described. When a voltage that causes the potential of the electrode 1 to exceed the potential of the electrode 2 is applied to the variable resistance element 5, ions of the metal are pulled toward the electrode 2 and enter the insulative film 4. When the ions of the metal reach the electrode 2, the upper and lower electrode 1 and electrode 2 become conductive, resulting in a low resistance state (LR writing). In this way, data is written into the variable resistance element 5 (LR writing). Conversely, when a voltage that causes the potential of the electrode 1 to be less than the potential of the electrode 2 is applied, ions of the metal are attracted to the electrode 1 and exit the insulative film 4. As a result, insulation properties across the upper and lower electrode 1 and electrode 2 increase, resulting in a high resistance state (HR writing). In this way, data is erased from the variable resistance element 5 (HR writing).

FIG. 15A and FIG. 15B show the waveforms of voltage pulses applied to the variable resistance element 5 when data recording is performed once.

FIG. 15A shows the waveform of a pulse when writing is performed (storing of data "1"). Here, first an erase voltage pulse PE is applied as a reverse polarity voltage pulse, and then a normal polarity PW voltage pulse corresponding to the data to be stored is applied. In other words, a voltage pulse P1 for storing the data "1" includes a set of two voltage pulses, PE and PW.

FIG. 15B shows the waveform of a pulse when erasing is performed (storing of data"0"). Here, first a write voltage pulse PW is applied as a reverse polarity voltage pulse, and then a normal polarity PE voltage pulse corresponding to the data to be stored is applied. In other words, a voltage pulse P0 which stores the data "0" includes a set of two voltage pulses, PW and PE.

Storing data in the variable resistance element 5 using the voltage pulses P1 and P0 shown in FIG. 15A and FIG. 15B limits the number of times the voltage pulse PW or PE of the same polarity are consecutively applied is limited to two or less. With this, it is possible to control a change of a resistance value of the variable resistance element 5 (an increase of a resistance value from LR state or a decrease of a resistance value from HR state) which is caused by successive application of the voltage pulse PW or PE having the same polarity many times, thereby extending rewrite life.

CITATION LIST

Patent Literature

[PTL 1] Japanese Unexamined Patent application Publication No. 2007-4935 (FIG. 1, FIG. 2)
[PTL 2] WO 2008/149484
[PTL 3] WO 2009/050833

SUMMARY OF INVENTION

Technical Problem

To summarize the conventional techniques disclosed in the Background Art, PTL 1 discloses a data storage method for increasing rewrite life by applying a voltage of one polarity to the variable resistance element before applying a voltage of a different polarity to the variable resistance element which corresponds to information to be stored.

One can anticipate a memory that is faster than a nonvolatile memory such as the commonly known flash memory by using this kind of variable resistance element as the memory cell.

However, in a memory cell using a variable resistance element, a problem exists such that when the amplitude of the high resistance writing voltage pulse is increased to enlarge the window of operation, the retention characteristics of the low resistance state (in other words, data retention characteristics) worsen, and conversely, when a lower high resistance writing voltage pulse is applied in order to improve the retention characteristics of the low resistance state, the resistance value of the high resistance state decreases, resulting in a reduced window of operation, thereby reducing reliability. With this conventional technique, a trade-off relationship exists between an increase in the window of operation and an improvement in retention characteristics. In other words, a problem exists in that it is difficult to achieve both of these. It should be noted the window of operation refers to a difference in the lowest resistance value achievable by the memory cell in the high resistance state that the highest resistance value achievable by the memory cell in the low resistance state (the resistance value margin in a resistance changing operation). Moreover, retention characteristics refer to the ability to retain data for a long period of time without the data being destroyed.

The present invention was conceived to solve the above-described problem and aims to provide a variable resistance nonvolatile memory element writing method and a variable resistance nonvolatile memory device capable of both improving retention characteristics and enlarging the window of operation.

Solution to Problem

In order to achieve the above-described goal, an aspect of the variable resistance nonvolatile memory element writing method according to the present invention is a method of writing to a variable resistance nonvolatile memory element that changes from a first resistance state for storing first information to a second resistance state for storing second information upon application of a pulse of a first voltage and changes from the second resistance state to the first resistance state upon application of a pulse of a second voltage having a polarity that is different than a polarity of the first voltage, the method of writing including weak writing and, subsequently, normal writing which change the variable resistance nonvolatile memory element from the first resistance state to the second resistance state, wherein in the weak writing, the variable resistance nonvolatile memory element is changed to the second resistance state by a pulse of a third voltage having a same polarity as the polarity of the first voltage and an absolute value that is different than an absolute value of the first voltage being applied to the variable resistance nonvolatile memory element and, subsequently, the variable resistance nonvolatile memory element is changed to an intermediate resistance state having a resistance value between a resistance value of the first resistance state and a resistance value of the second resistance state by a pulse of a fourth voltage having a same polarity as the polarity of the second voltage and an absolute value that is less than an absolute value of the second voltage being applied to the variable resistance nonvolatile memory element, in the normal writing, the variable resistance nonvolatile memory element is changed from the intermediate resistance state to the second resistance state by a pulse of the first voltage being applied to the variable resistance nonvolatile memory element at least once, and the absolute value of the fourth voltage is less than the absolute value of the third voltage.

Moreover, in order to achieve the above-described goal, an aspect of the variable resistance nonvolatile memory device according to the present invention includes: a variable resistance nonvolatile memory element including a first electrode, a second electrode, and a variable resistance layer interposed between the first electrode and the second electrode; and a write circuit that writes information to the variable resistance nonvolatile memory element, wherein the variable resistance nonvolatile memory element changes from a first resistance state for storing first information to a second resistance state for storing second information upon application of a pulse of a first voltage and changes from the second resistance state to the first resistance state upon application of a pulse of a second voltage having a polarity that is different than a polarity of the first voltage, the write circuit performs weak writing and, subsequently, normal writing which change the variable resistance nonvolatile memory element from the first resistance state to the second resistance state, in the weak writing, the variable resistance nonvolatile memory element is changed to the second resistance state by a pulse of a third voltage having a same polarity as the polarity of the first voltage and an absolute value that is different than an absolute value of the first voltage being applied to the variable resistance nonvolatile memory element and, subsequently, the variable resistance nonvolatile memory element is changed to an intermediate resistance state having a resistance value between a resistance value of the first resistance state and a resistance value of the second resistance state by a pulse of a fourth voltage having a same polarity as the polarity of the second voltage and an absolute value that is less than an absolute value of the second voltage being applied to the variable resistance nonvolatile memory element, in the normal writing, the variable resistance nonvolatile memory element is changed from the intermediate resistance state to the second resistance state by a pulse of the first voltage being applied to the variable resistance nonvolatile memory element at least once, and the absolute value of the fourth voltage is less than the absolute value of the third voltage.

Advantageous Effects of Invention

The present invention allows for the window of operation to be enlarged and retention characteristics to be improved, as well as allow for the reliability of the variable resistance nonvolatile memory device to be greatly improved.

Consequently, the practical significance of the present invention is extremely great in these times which await a variable resistance nonvolatile memory device capable of high-speed operation and suitable for large-capacity storage.

BRIEF DESCRIPTION OF DRAWINGS

FIG. 11 is for illustrating the voltage settings for each operation according to an embodiment of the present invention.

DESCRIPTION OF EMBODIMENTS

Underlying Knowledge Forming Basis of the Present Invention

In light of the information disclosed above, as one variable resistance nonvolatile memory device, the inventors of the present invention have examined a variable resistance nonvolatile memory device provided with memory cells, each including a switching element and a variable resistance layer comprising an oxygen-deficient oxide of the transition metal tantalum (Ta) (tantalum oxide).

Here, an oxygen-deficient oxide refers to an oxide that is deficient in oxygen relative to its stoichiometric composition.

Here, various attributes gained from experiments on the variable resistance element having a variable resistance layer comprising an oxygen-deficient Ta oxide (TaO$_x$, 0<x<2.5) will be described to convey the problem to be solved by the present invention. It should be noted PTL 2 and 3 recited in Background Art disclose the following information in detail.

Figure 16:
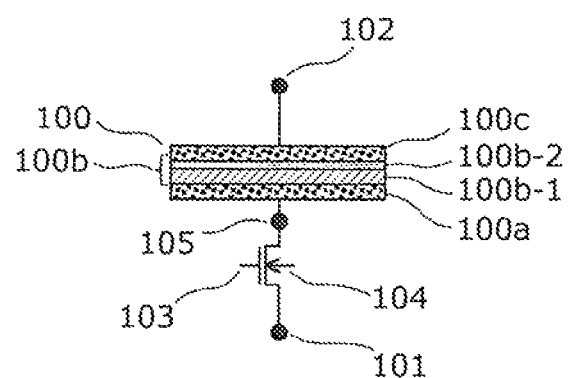
FIG. 16 is a schematic diagram of the configuration of a 1T1R memory cell using a conventional variable resistance element.

FIG. 16 is a schematic diagram of the configuration (1-bit configuration) of a 1T1R memory cell using a conventional variable resistance element. As FIG. 16 shows, the 1T1R memory cell usually includes an NMOS transistor 104 and a variable resistance element 100.

As is shown in FIG. 16, the variable resistance element 100 is formed by stacking: a lower electrode 100a; a variable resistance layer 100b including a first variable resistance layer 100b-1 (a low resistance tantalum oxide layer comprising the previously-stated oxygen-deficient Ta oxide (TaO$_x$, 0<x<2.5)) and a second variable resistance layer 100b-2 (a high resistance tantalum oxide layer (TaO$_y$, x<y)); and an upper electrode 100c. A lower electrode terminal 105 is led out from the lower electrode 100a, and an upper electrode terminal 102 is led out from the upper electrode 100c. Moreover, the NMOS transistor 104, a selection transistor (in other words, a switching element), includes a gate terminal 103. The lower electrode terminal 105 of the variable resistance element 100 and one of the source and the drain (N diffusion) regions of the NMOS transistor 104 are connected in series to each other. The other of the source and the drain (N$^+$ diffusion) regions that is not connected to the variable resistance element 100 is led out as a lower electrode terminal 101. A substrate terminal is connected to a ground potential. Here, the high resistance second variable resistance layer 100b-2 is positioned on the upper electrode terminal 102 side opposite to the NMOS transistor 104.

As disclosed in PTL 3, a relevant patent, examples of material for the upper electrode 100c include Pt (platinum), Ir (iridium), Pd (palladium), Ag (silver), Ni (nickel), W (tungsten), or Cu (copper). Moreover, PTL 3 discloses that resistance change is likely to occur near an interface of the variable resistance layer and the electrode material having a standard electrode potential higher than that of Ta, the constituent element of the variable resistance layer 100b, and is not likely to occur when the electrode material has a standard electrode potential lower than that of Ta. Furthermore, resistance change is more likely to occur the greater the difference between standard electrode potentials of the metal included the variable resistance layer and the electrode material, and less likely to occur the smaller the difference. It should be noted standard electrode potential is generally one index of oxidizability, and a higher standard electrode potential indicates a higher tendency to be oxidized while a lower standard electrode potential indicates a lower tendency to be oxidized. In particular, it is preferable to use Pt or Ir for an electrode because the high standard electrode thereof yields a satisfactory resistance changing operation.

Furthermore in the memory cell shown in FIG. 16, when a voltage (a low resistance writing voltage pulse) greater than or equal to a given voltage (e.g., a first threshold voltage) is applied to the lower electrode terminal 101 with reference to the upper electrode terminal 102, the oxidation occurs near the interface with the upper electrode 100c, and the variable resistance element 100 changes to a low resistance state, whereas when a voltage (a high resistance writing voltage pulse) greater than or equal to another given voltage (e.g., a second threshold voltage) is applied to the upper electrode terminal 102 with reference to the lower electrode terminal 101, the oxidation occurs near the interface with the upper electrode 100c, and the variable resistance element 100 changes to a high resistance state. Here, the application direction of the low resistance writing voltage pulse is defined as a negative voltage direction, and the application direction of the high resistance writing voltage pulse is defined as a positive voltage direction.

However, as previously described, in a memory cell using a variable resistance element, a problem exists such that when the amplitude of the high resistance writing voltage pulse is increased to enlarge the window of operation, the retention characteristics of the low resistance state (in other words, data retaining characteristics) worsen, and conversely, when a lower high resistance writing voltage pulse is applied in order to improve the retention characteristics of the low resistance state, the resistance value of the high resistance state decreases, resulting in a reduced window of operation, thereby reducing reliability. With this conventional technique, a trade-off relationship exists between an increase in the window of operation and an improvement in retention characteristics. In other words, a problem exists in that it is difficult to achieve both of these. It should be noted the window of operation refers to a difference in the lowest resistance value achievable by the memory cell in the high resistance state that the highest resistance value achievable by the memory cell in the low resistance state (the resistance value margin in a resistance changing operation). Moreover, retention characteristics refer to the ability to retain data for a long period of time without the data being destroyed.

Hereinafter, the problem according to the present invention will be described in detail. Here, the writing and retention characteristics, and problems related thereto, of a 1T1R memory cell such as the one shown in FIG. 16 including the variable resistance elements 100, each including the upper electrode 100c comprising Ir (iridium), the lower electrode 100a comprising TaN (tantalum nitride), the first variable resistance layer 100b-1 which is a tantalum oxide layer ($TaO_x$, $0<x<2.5$), and the second variable resistance layer 100b-2 which is a tantalum oxide layer ($TaO_y$, $x<y$), will be discussed.

The sample used in the experiments includes, the variable resistance layer 100b having an area of 0.25 $\mu m^2$ (=0.5 $\mu m \times 0.5$ $\mu m$); the first variable resistance layer 100b-1 ($TaO_x$: x=1.54, film thickness; 30 nm) in contact with the lower electrode 100a; and the second variable resistance layer 100b-2 ($TaO_y$: y=2.47, film thickness: 6 nm) in contact with the upper electrode 100c. The NMOS transistor 104, the switching element, has a gate width W of 0.44 $\mu m$, a gate length L of 0.18 $\mu m$, and a gate insulator film thickness Tox of 3.5 nm.

The second variable resistance layer 100b-2 ($TaO_{2.47}$) is formed, by sputtering, above the first variable resistance layer 100b-1 ($TaO_{1.54}$) formed by sputtering, before the upper electrode 100c is formed. Compared to the first variable resistance layer 100b-1 ($TaO_{1.54}$), the second variable resistance layer 100b-2 ($TaO_{2.47}$) has a higher degree of oxygen deficiency, in other words, has a structure that has a significantly high resistance value and is nearly an insulator. As such, in order to perform a resistance changing operation, a constant forming voltage must first be applied for a given period of time to form a conductive path in the second variable resistance layer 100b-2.

Figure 1A:
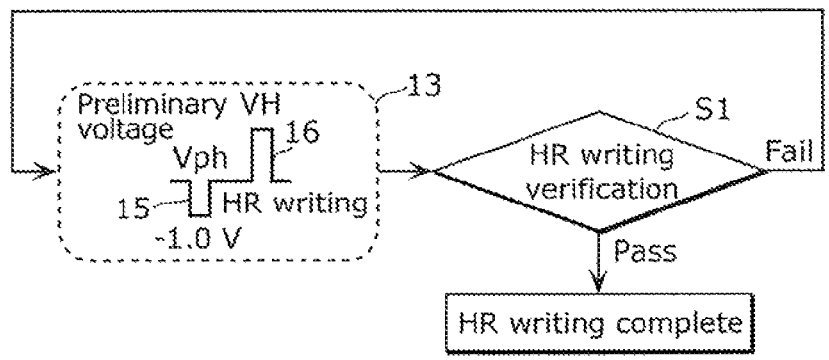
FIG. 1A is a high resistance (HR) writing flow chart illustrating the HR verify writing according to the present invention.

In regard to a memory cell array (for example, 64 kbit) in which 1T1R memory cells using the variable resistance elements 100 shown in FIG. 16 are arranged in a matrix, the high resistance (HR) verify writing (high resistance writing involving verification) shown in FIG. 1A was performed on all bits in the memory cell array. Moreover, the low resistance (LR) verify writing (low resistance writing involving verification) shown in FIG. 1B was performed on all bits in the memory cell array. The HR writing voltage VH dependency of the average HR resistance value and the average LR resistance value when all bits in the memory cell array are rewritten to the HR state and the LR state is shown in FIG. 1C, and the HR writing voltage VH dependency of the average amount of decrease in LR current in the retention characteristics evaluation after 66 hours at 150 degrees Celsius when all bits in the memory cell array of the present invention are set to the low resistance (LR) state is shown in FIG. 1D. Here, the average amount of decrease in LR current is the level of decrease in current flowing under application of a constant voltage to a memory cell in the low resistance state before and after retention, that is to say, the level of increase in resistance value in the low resistance state. This value indicates the degree of degradation of the retention characteristics in the low resistance state.

It should be noted the nonvolatile memory device including the memory cell array of the 1T1R memory cells arranged in a matrix is configured of circuits which perform these kinds of operations, and the since essential parts will be discussed later, details thereof are omitted here. Moreover, in the present Specification, high resistance writing (or low resistance writing) of the memory cell equates to, technically, the changing of the variable resistance element included in the memory cell (in other words, the variable resistance nonvolatile memory element) to a high resistance state (or low resistance state).

FIG. 1A is a HR writing flow chart illustrating the HR verify writing operation for a given 1-bit memory cell. A high resistance (HR) writing voltage pulse set 13 is applied to the 1T1R memory cell shown in FIG. 16, and then it is verified whether the cell current of the write target cell is lower than a given HR cell current level or not (in other words, whether or not the HR writing has been completed) (HR writing verification S1). Here, if the HR writing verification S1 fails, the high resistance writing voltage pulse set 13 is once again applied to the write target cell, and the HR writing verification S1 is performed once again. This operation is thereafter repeated until the HR writing verification S1 passes.

Here, the HR writing voltage pulse set 13 includes, for example, two pulses: a negative voltage preliminary voltage pulse 15 (preliminary voltage Vph=−1.0 V, pulse width 50 ns) which applies a voltage of +1.0 V to the lower terminal 101 while a gate voltage VG=2.4 V is being applied to the gate terminal 103 of the memory cell shown in FIG. 16 (at this time a ground voltage is applied to the upper electrode terminal 102), and a high resistance (HR) writing voltage pulse 16 (HR writing voltage VH, pulse width 50 ns) that is a positive voltage which applies a HR writing voltage VH (for example, +1.8 V to +2.4 V) to the upper electrode terminal 102 while a gate voltage VG=2.4 V is being applied to the gate terminal 103 of the memory cell shown in FIG. 16 (at this time a ground voltage is applied to the lower terminal 101).

It should be noted, when changing the variable resistance element to the high resistance state, the reason for applying a weak voltage pulse having a polarity opposite that of the high resistance voltage (negative voltage preliminary voltage pulse 15) directly before the normal high resistance (HR) writing voltage pulse 16 (in other words, performing weak inversion writing) is to further increase the resistance value of the variable resistance element after it changes to the high resistance state (further increase the high-resistance performance). This enlarges the window of operation.

Figure 1B:
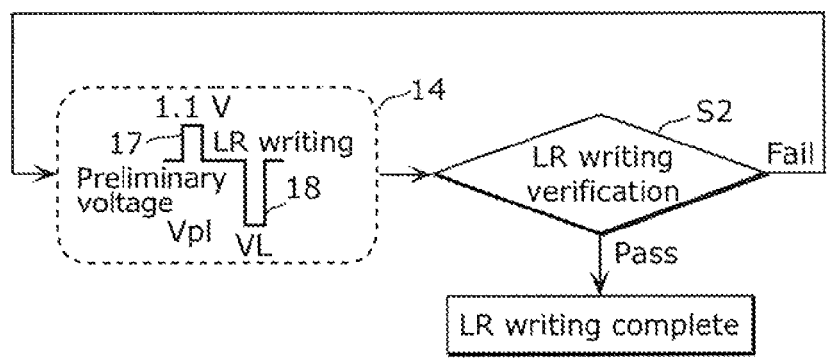
FIG. 1B is a low resistance (LR) writing flow chart illustrating the LR verify writing according to the present invention.
Figure 1C:
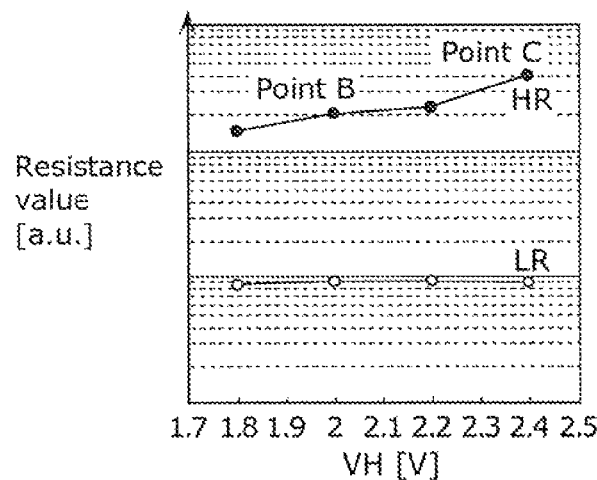
FIG. 1C is a characteristic diagram which shows the HR writing voltage VH dependency of an average HR resistance value and an average LR resistance value when all bits in the memory cell array of the present invention are rewritten to HR and LR states.
Figure 1D:
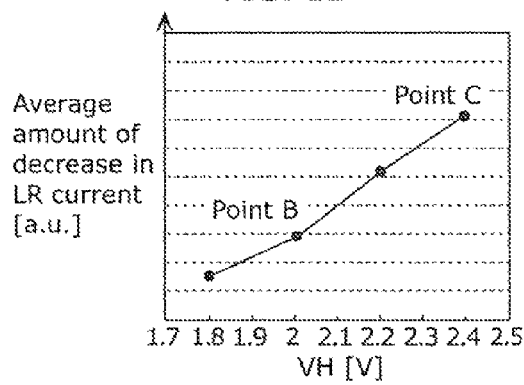
FIG. 1D is a characteristic diagram which shows the HR writing voltage VH dependency of an average change amount in LR current after 66 hours of retention at 150 degrees Celsius when all bits in the memory cell array of the present invention are set to the LR state.

FIG. 1B is a LR writing flow chart illustrating the LR verify writing operation for a given 1-bit memory cell. A low resistance (LR) writing voltage pulse set 14 is applied to the 1T1R memory cell shown in FIG. 16, and then it is verified whether the cell current of the write target cell is greater than a given LR cell current level or not (in other words, whether or not the LR writing has been completed) (LR writing verification S2). Here, if the LR writing verification S2 fails, the low resistance writing voltage puke set 14 is once again applied to the write target cell, and the LR writing verification S2 is performed once again. This operation is thereafter repeated until the LR writing verification S2 passes.

Here, the LR writing voltage pulse set 14 includes, for example, two pulses: a positive voltage preliminary voltage pulse 17 (preliminary voltage Vpl=+1.1 V, pulse width 50 ns) which applies a voltage of +1.1 V to the upper electrode terminal 102 while a gate voltage VG=2.4 V is being applied to the gate terminal 103 of the memory cell shown in FIG. 16 (at this time a ground voltage is applied to the lower electrode 101), and a low resistance (LR) writing voltage pulse 18 (LR writing voltage VL=−2.4 V, pulse width 50 ns) that is a positive voltage which applies a voltage of +2.4 V to the lower terminal 101 while a gate voltage VG=2.4 V is being applied to the gate terminal 103 (at this time a ground voltage is applied to the upper electrode terminal 102).

It should be noted, when changing the variable resistance element to the low resistance state, the reason for applying a weak voltage pulse having a polarity opposite that of the low resistance voltage (positive voltage preliminary voltage pulse 17) directly before the normal low resistance (LR) writing voltage pulse 18 (in other words, performing weak inversion writing) is to further decrease the resistance value of the variable resistance element after it changes to the low resistance state (further increase the low-resistance performance). This enlarges the window of operation.

In FIG. 1C, the vertical axis represents the resistance value of the memory cell. Here, the resistance value is measured by applying a gate voltage VG=1.8 V to the gate terminal 103 of the memory cell shown in FIG. 16 and applying a voltage of +0.4 V to the upper electrode terminal 102 of the memory cell shown in FIG. 16 (at this time a ground voltage is applied to the lower terminal 101). Average HR resistance values when all bits in the memory cell array are set to the HR state, and average LR resistance values when all bits in the memory cell array are set to the LR state are plotted in FIG. 1C. The horizontal axis represents the HR write voltage VH. Here, the average HR resistance value and the average LR resistance value drop when the HR writing voltage VH is increased while the LR writing voltage VL is fixed.

As FIG. 1C shows, when the HR writing voltage VH in increased while the LR writing voltage VL (−2.4 V) is fixed, the average HR resistance value monotonically increases, but the average LR resistance value stays roughly the same, causing the window of operation to monotonically increase. In other words, it can be deduced from FIG. 1C that increasing the HR writing voltage VH will enlarge the window of operation.

In FIG. 1D, the vertical axis represents the average amount of decrease in LR current after 66 hours at 150 degrees Celsius, and the horizontal axis is the same as in FIG. 1C. Here, the current is measured by applying a gate voltage VG=1.8 V to the gate terminal 103 of the memory cell shown in FIG. 16 and applying a read voltage of +0.4 V to the upper electrode terminal 102 of the memory cell shown in FIG. 16 (at this time a ground voltage (0 V) is applied to the lower terminal 101). Moreover, the average amount of decrease in LR current is plotted when the HR writing voltage VH is increased while the LR writing voltage VL is fixed.

As FIG. 1D shows, when the HR writing voltage VH is increased while the LR writing voltage VL (−2.4 V) is fixed, the average amount of decrease in LR current monotonically increases, and the LR retention characteristics worsen. In other words, it can be deduced from FIG. 1D that increasing the HR writing voltage VH will cause the retention characteristics in the low resistance state to worsen.

Thus, regarding the rewrite voltage balance between the HR writing voltage VH and the LR writing voltage VL (−2.4 V), when increasing the HR writing voltage VH in order to enlarge the window of operation, the effect that the HR writing voltage VH has on the retention characteristics outweighs the benefits, causing the LR retention characteristics to worsen.

Figure 2:
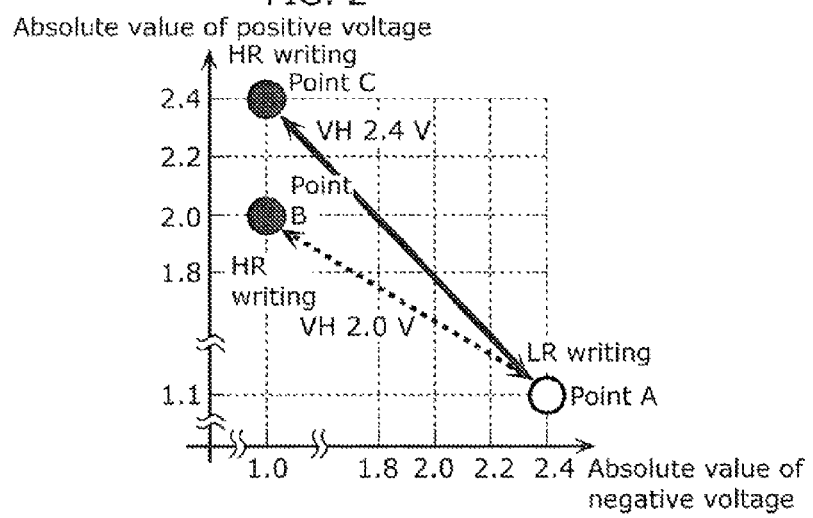
FIG. 2 is for illustrating the rewrite voltage operating point when the HR verify writing and the LR verify writing are alternately and repeatedly performed according to the present invention.

FIG. 2 is for illustrating the rewrite voltage operating point when the HR verify writing shown in FIG. 1A and the LR verify writing shown in FIG. 1B are alternately and repeatedly performed.

In FIG. 2, the horizontal axis represents the absolute value of the applied negative voltage, and the vertical axis represents the absolute value of the applied positive voltage. In FIG. 2, point B corresponds to point B in FIG. 1C and FIG. 1D, and indicates an operating point in HR writing at which the preliminary voltage Vph (−1.0 V) is first applied followed by the HR writing voltage VH (+2.0 V) as the high resistance writing voltage pulse set 13. Point C corresponds to point C in FIG. 1C and FIG. 1D, and indicates an operating point in HR, writing at which the preliminary voltage Vph (−1.0 V) is first applied followed by the HR writing voltage VH (+2.4 V) as the high resistance writing voltage pulse set 13. Point A indicates an operating point in LR writing at which the preliminary voltage Vph (+1.1 V) is first applied followed by the LR writing voltage VL (−2.4 V) as the low resistance writing voltage pulse set 14.

When the memory cell is operated between the two operating points point. B and point A shown in FIG. 2, the LR retention characteristics are favorable as the average amount of decrease in LR current is relatively low. However, the window of operation narrows since the HR writing voltage VH is slightly low (2.0 V).

On the other hand, when the memory cell is operated between the two operating points point C and point A, the window of operation enlarges, but since the HR writing voltage VH is increases from 0.0 V to 2.4 V, the effect that the HR writing voltage has on the retention characteristics outweighs the benefits, causing the LR retention characteristics to worsen in regard to rewriting voltage balance with the LR writing voltage VL (−2.4 V).

Thus, in regard to the HR writing voltage VH, there is a trade-off between the window of operation and the LR retention characteristics, and it has been found that uncovering a balanced combination of the HR writing voltage VH and the LR writing voltage VL (in other words, two operating points) unequivocally is exceptionally difficult.

In view of this information, the inventors of the present invention have examined a new method of writing to the variable resistance nonvolatile memory element which allows for both the improvement of retention characteristics and the enlargement of the window of operation when causing the variable resistance element in the high resistance state to change to the low resistance state by applying a weak high-resistance writing voltage pulse set which puts the variable resistance element into a weak high-resistance (weak HR) state (in other words, a new operating point) before causing the variable resistance element in the high resistance state to change to the low resistance state by applying a low resistance writing voltage pulse to the variable resistance element. Here, the weak high-resistance (weak HR) state is an intermediate resistance state of the variable resistance nonvolatile memory element which reversibly changes between two states (the first resistance state and the second resistance state). The intermediate state has a resistance value between a resistance value of the first resistance state and a resistance value of the second resistance state.

More specifically, an aspect of the variable resistance nonvolatile memory element writing method according to the present invention is a method of writing to a variable resistance nonvolatile memory element that changes from a first resistance state for storing first information to a second resistance state for storing second information upon application of a pulse of a first voltage and changes from the second resistance state to the first resistance state upon application of a pulse of a second voltage having a polarity that is different than a polarity of the first voltage, the method of writing including weak writing and, subsequently, normal writing which change the variable resistance nonvolatile memory element from the first resistance state to the second resistance state, wherein in the weak writing, the variable resistance nonvolatile memory element is changed to the second resistance state by a pulse of a third voltage having a same polarity as the polarity of the first voltage and an absolute value that is different than an absolute value of the first voltage being applied to the variable resistance nonvolatile memory element and, subsequently, the variable resistance nonvolatile memory element is changed to an intermediate resistance state having a resistance value between a resistance value of the first resistance state and a resistance value of the second resistance state by a pulse of a fourth voltage having a same polarity as the polarity of the second voltage and an absolute value that is less than an absolute value of the second voltage being applied to the variable resistance nonvolatile memory element, in the normal writing, the variable resistance nonvolatile memory element is changed from the intermediate resistance state to the second resistance state by a pulse of the first voltage being applied to the variable resistance nonvolatile memory element at least once, and the absolute value of the fourth voltage is less than the absolute value of the third voltage.

With this, when the variable resistance nonvolatile memory element is changed from the first resistance state to the second resistance state, the variable resistance nonvolatile memory element is first set to the intermediate resistance state by the weak writing and then it is caused to change to the second resistance state by the normal writing, rather than solely employing a normal write operation. As a result, the variable resistance nonvolatile memory element does not change from the first resistance state to the second resistance state, but from the intermediate resistance state, which is closer to the second resistance state than the first resistance state, to the second resistance state. This changes the variable resistance nonvolatile memory element to a deeper second resistance state. Consequently, the retention characteristics in the second resistance state are improved while maintaining the window of operation.

The weak HR writing is performed, for example, once before the LR writing. The variable resistance nonvolatile memory element is first changed to the weak HR state in the LR writing, and then the writing voltage balance is shifted toward the LR state in the LR writing performed thereafter. This makes it possible to relatively increase the functionability of the LR writing and improve the retention characteristics. Moreover, in the HR writing, it becomes possible to write at a sufficiently high HR writing voltage, causing the resistance value in the HR state to increase, whereby the window of operation is also enlarged at the same time. This makes it is possible to both enlarge the window of operation and improve retention characteristics, as well as greatly improve the reliability of the variable resistance nonvolatile memory device.

Here, the absolute value of the third voltage may be less than the absolute value of the first voltage. With this, the weak writing can be performed with an erase current that is smaller than in the normal writing since a voltage (third voltage) having an absolute value that is less than that of the voltage (first voltage) used in the normal writing is used in the weak writing.

Moreover, in the normal writing, a pulse of a fifth voltage having a same polarity as the polarity of the second voltage and an absolute value that is less than the absolute value of the fourth voltage and, subsequently, a pulse of the first voltage may be applied to the variable resistance nonvolatile memory element.

With this, in the normal writing, writing is performed using a weak voltage pulse having a different polarity (weak inversion writing) before the normal voltage pulse is applied, increasing the writing performance and enlarging the window of operation.

Moreover, the method of writing may further include verifying, after the normal writing, whether writing for the second resistance state is complete, wherein the normal writing and the verifying are repeated until it is verified in the verifying that the writing for the second resistance state is complete.

With this, incomplete writing is avoided by repeating the normal writing until writing for the second resistance state is complete.

Moreover, in order to achieve the above-described goal, an aspect of the variable resistance nonvolatile memory device according to the present invention includes: a variable resistance nonvolatile memory element including a first electrode, a second electrode, and a variable resistance layer interposed between the first electrode and the second electrode; and a write circuit that writes information to the variable resistance nonvolatile memory element, wherein the variable resistance nonvolatile memory element changes from a first resistance state for storing first information to a second resistance state for storing second information upon application of a pulse of a first voltage and changes from the second resistance state to the first resistance state upon application of a pulse of a second voltage having a polarity that is different than a polarity of the first voltage, the write circuit performs weak writing and, subsequently, normal writing which change the variable resistance nonvolatile memory element from the first resistance state to the second resistance state, in the weak writing, the variable resistance nonvolatile memory element is changed to the second resistance state by a pulse of a third voltage having a same polarity as the polarity of the first voltage and an absolute value that is different than an absolute value of the first voltage being applied to the variable resistance nonvolatile memory element and, subsequently, the variable resistance nonvolatile memory element is changed to an intermediate resistance state having a resistance value between a resistance value of the first resistance state and a resistance value of the second resistance state by a pulse of a fourth voltage having a same polarity as the polarity of the second voltage and an absolute value that is less than an absolute value of the second voltage being applied to the variable resistance nonvolatile memory element, in the normal writing, the variable resistance nonvolatile memory element is changed from the intermediate resistance state to the second resistance state by a pulse of the first voltage being applied to the variable resistance nonvolatile memory element at least once, and the absolute value of the fourth voltage is less than the absolute value of the third voltage.

With this, when the variable resistance nonvolatile memory element is changed from the first resistance state to the second resistance state, the variable resistance nonvolatile memory element is first set to the intermediate resistance state by the weak writing and then it is caused to change to the second resistance state by the normal writing. As a result, the variable resistance nonvolatile memory element does not change from the first resistance state to the second resistance state, but from the intermediate resistance state, which is closer to the second resistance state than the first resistance state, to the second resistance state. This changes the variable resistance nonvolatile memory element to a deeper second resistance state. Consequently, the retention characteristics in the second resistance state are improved while maintaining the window of operation.

Here, the absolute value of the third voltage may be less than the absolute value of the first voltage. With this, the weak writing can be performed with an erase current that is smaller than in the normal writing since a voltage (third voltage) having an absolute value that is less than that of the voltage (first voltage) used in the normal writing is used in the weak writing.

Moreover, in the normal writing, the write circuit may apply a pulse of a fifth voltage having a same polarity as the polarity of the second voltage and an absolute value that is less than the absolute value of the fourth voltage and, subsequently, a pulse of the first voltage to the variable resistance nonvolatile memory element.

With this, in the normal writing, before the normal voltage pulse is applied, writing is performed using a weak voltage pulse having a different polarity (weak inversion writing), increasing the writing performance and enlarging the window of operation.

Moreover, the variable resistance nonvolatile memory device may further include: a read circuit that reads information from the variable resistance nonvolatile memory element; and a control circuit that controls the write circuit and the read circuit and verifies, after the normal writing by the write circuit, whether writing for the second resistance state is complete by referring to information read by the read circuit, wherein the control circuit controls the write circuit and the read circuit to repeat (i) the writing by the write circuit to change the variable resistance nonvolatile memory element from the first resistance state to the second resistance state and (ii) the verifying until the control circuit verifies that the writing for the second resistance state is complete.

With this, incomplete writing is avoided by repeating the normal writing until writing for the second resistance state is complete.

Moreover, the variable resistance nonvolatile memory element may be included in a memory cell with a selecting element that is connected in series to the variable resistance nonvolatile memory element and switchable between a conducting state and a nonconducting state, and the write circuit may perform the weak writing and the normal writing on the variable resistance nonvolatile memory element included in the memory cell.

With this, writing which makes it possible to both improve retention characteristics and enlarge the window of operation can be performed on the variable resistance nonvolatile memory element included in the memory cell.

Moreover, the variable resistance nonvolatile memory element may have a higher resistance value in the first resistance state than in the second resistance state. With this, writing which makes it possible to both improve retention characteristics and enlarge the window of operation can be performed in the low resistance writing.

Embodiment

Next, an embodiment of the variable resistance nonvolatile memory element writing method and the variable resistance nonvolatile memory device according to the present invention will be described in detail with reference to the drawings. It should be noted the embodiment described below shows a specific example of the present invention. The numerical values, shapes, materials, structural elements, the arrangement and connection of the structural elements, steps, the processing order of the steps etc. shown in the following exemplary embodiment are mere examples, and therefore do not limit the present invention, the scope of which is limited only by the appended Claims. Therefore, among the structural elements in the following exemplary embodiment, structural elements not recited in any one of the independent claims defining the most generic part of the inventive concept are described as preferred structural elements, and are not absolutely necessary to overcome the problem according to the present invention.

It should be noted the variable resistance nonvolatile memory element according to this embodiment may have the same structure as that of the variable resistance element 100 shown in FIG. 16. In other words, the variable resistance nonvolatile memory element according to this embodiment may have the following characteristics.

The variable resistance layer 100b is interposed between the lower electrode 100a and the upper electrode 100c and has a resistance value which changes reversibly based on an electric signal applied between the lower electrode 100a and the upper electrode 100c. For example, it is a layer which reversibly changes between a high resistance state and a low resistance state depending on the polarity of a voltage applied between the lower electrode 100a and the upper electrode 100c. The variable resistance layer 100b has a stacked structure including at least two layers: the first variable resistance layer 100b-1 which is connected to the lower electrode 100a and the second variable resistance layer 100b-2 which is connected to the upper electrode 100c.

The first variable resistance layer 100b-1 comprises a first metal oxide which is oxygen deficient, and the second variable resistance layer 100b-2 comprises a second metal oxide that is less oxygen deficient than the first metal oxide. A small local region is formed in the second variable resistance layer 100b-2 of the variable resistance element whose degree of oxygen deficiency reversibly changes depending on the electric pulse applied. It is conceivable that the local region includes a filament formed from an oxygen defect site.

The degree of oxygen deficiency is a rate of oxygen deficiency relative to the amount of oxygen included in a metal oxide having a stoichiometric composition (the stoichiometric composition having the highest resistance value when multiple stoichiometric compositions are present). A metal oxide having a stoichiometric composition is more stable and has a higher resistance value than a metal oxide having a non-stoichiometric composition.

For example, when the metal is tantalum (Ta), the composition is expressed as $TaO_{2.5}$ since the stoichiometric oxide composition, as defined above, is $Ta_2O_5$. The degree of oxygen deficiency of $TaO_{2.5}$ is 0%, so the degree of oxygen deficiency of $TaO_{1.5}$ is 40% ((2.5−1.5)/2.5=40%). Moreover, a metal oxide having excess oxygen atoms has a negative degree of oxygen deficiency. It should be noted within the present Specification, unless otherwise noted, the degree of oxygen deficiency includes positive values, 0, and negative values.

An oxide laving a low degree of oxygen deficiency has a high resistance value since it is closer to an oxide having a stoichiometric composition, and an oxide having a high degree of oxygen deficiency has a low resistance value since it is closer to a metal comprising an oxide.

The oxygen content atomic percentage is a ratio of the number of oxygen atoms to total number of atoms. For example, the oxygen content atomic percentage of $Ta_2O_5$ is 71.4 atm %, which is the ratio of the number of oxygen atoms to the total number of atoms (O/(Ta+O)). Thus, an oxygen-deficient tantalum oxide has an oxygen content atomic percentage that is greater than 0 and less than 71.4 atm %. For example, when the metal included in the first metal oxide and the metal included in the second metal oxide comprise the same constituent metal, the oxygen content atomic percentage corresponds with the degree of oxygen deficiency. That is to say, when the oxygen content atomic percentage of the second metal oxide is greater than the oxygen content atomic percentage of the first metal oxide, the degree of oxygen deficiency of the second metal oxide is less than the degree of oxygen deficiency of the first metal oxide.

A metal other than tantalum may be used for the variable resistance layer 100b. A transition metal or aluminum (Al) can be used for the variable resistance layer 100b. Tantalum (Ta), titanium (Ti), hafnium (Hf), zirconium (Zr), niobium (Nb), tungsten (W) and such may be used as the transition metal. Since transition metals can assume many different oxidation states, it is possible to achieve different resistance states through oxidation-reduction reactions.

For example, the resistance value of variable resistance layer 100b can be changed at high-speed and in a stable manner when hafnium oxide is used and the composition of the first metal oxide is $HfO_x$ where x is no less than 0.9 and no more than 1.6, and the composition of the second metal oxide is $HfO_y$ where y is greater than x. In this case, it is preferable that the second metal oxide have a thickness of no less than 3 nm and no more than 4 nm.

Moreover, the resistance value of variable resistance layer 100b can be changed at high-speed and in a stable manner when zirconium oxide is used and the composition of the first metal oxide is $ZrO_x$ where x is no less than 0.9 and no more than 1.4, and the composition of the second metal oxide is $ZrO_y$ where y is greater than x. In this case, it is preferable that the second metal oxide have a thickness of no less than 1 nm and no more than 5 nm.

The first metal included in the first metal oxide and the second metal included in the second metal oxide may be different metals. In this case, the second metal oxide may have a lower level of oxygen deficiency than the first metal oxide, in other words, may have a high level of resistance. By adopting such a configuration, the voltage applied between the lower electrode 100a and the upper electrode 100c in a resistance change is distributed to the second metal oxide in majority, thereby allowing the oxidation-reduction reactions to occur more easily in the second metal oxide.

Moreover, when mutually different materials are used as the first metal included in the first metal oxide to function as the first variable resistance layer 100b-1 and the second metal included in the second metal oxide to function as the second variable resistance layer 100b-2, the standard electrode potential of the second metal may be lower than the standard electrode potential of the first metal. The higher the standard electrode potential, the less tendency a metal has to be oxidized. As such, oxidation-reduction reactions can occur relatively easily in the second metal oxide having a relatively low standard electrode potential. It should be noted this is because it is conceivable that the resistance changing phenomenon is the changing of the filament (conductive path) as oxidation-reduction reactions occur in the small local region formed inside the high-resistance second metal oxide, causing the resistance value (level of oxygen deficiency) to change.

For example, by using oxygen-deficient tantalum oxide ($TaO_x$) for the first metal oxide and titanium oxide ($TiO_2$) for the second metal oxide, a stable resistance changing operation can be achieved. Titanium (standard electrode potential=−1.63 eV) has a lower standard electrode potential than tantalum (standard electrode potential=−0.6 eV). Oxidation-reduction reactions can be made to occur more easily in the second metal oxide by using, for the second metal oxide, a metal oxide having a lower standard electrode potential than that of first metal oxide. As an example of other possible compositions, aluminum oxide ($Al_2O_3$) may be used for the second metal oxide to function as the high resistance layer. For example, oxygen-deficient tantalum oxide ($TaO_x$) may be used for the first metal oxide and aluminum oxide ($Al_2O_3$) may be used for the second metal oxide.

This is because it is conceivable that the resistance changing phenomenon in the variable resistance layer 100b in the stacked structure is the changing of the filament (conductive path) inside the local region formed in the high-resistance second metal oxide as oxidation-reduction reactions occur in the small local region causing the resistance value to change.

In other words, when a positive voltage is applied to the upper electrode 100c connected to the second metal oxide with reference to the lower electrode 100a, the oxygen ions inside the variable resistance layer 100b are drawn to the second metal oxide side. This causes oxidation reactions to occur in the small local region formed in the second metal oxide and the degree of oxygen deficiency to decrease. Therefore, it is conceivable that the filament inside the local region becomes more difficult to connect to and the resistance value increases.

On the other hand, when a negative voltage is applied to the upper electrode 100c connected to the second metal oxide with reference to the lower electrode 100a, the oxygen ions inside the second metal oxide are pushed to the first metal oxide side. This causes reduction reactions to occur in the small local region formed in the second metal oxide and the degree of oxygen deficiency to increase. Therefore, it is conceivable that that the filament inside the local region becomes more easily connectable and the resistance value decreases.

The upper electrode 100c connected to the second metal oxide having a lower degree of oxygen deficiency includes a material, such as platinum (Pt), iridium (Ir), or palladium (Pd), having a standard electrode potential that is higher than that of the material included in the lower electrode 100a and the metal included in the second metal oxide. Moreover, the lower electrode 100a connected to the first metal oxide having a high degree of oxygen deficiency may include a material, such as tungsten (W), nickel (Ni), tantalum (Ta), titanium (Ti), aluminum (Al), tantalum nitride (TaN), or titanium nitride (TiN), having a standard electrode potential that is lower than that of the metal included in the first metal oxide. The higher the standard electrode potential, the less tendency a metal has to be oxidized.

In other words, between a standard electrode potential V2 of the second electrode, a standard electrode potential Vr2 of the metal included in the second metal oxide, a standard electrode potential Vr1 of the metal included in the first metal oxide, and a standard electrode potential V1 of the first electrode, the relationships $V_{r2}<V_2$ and $V_1<V_2$ may be satisfied. Furthermore, the relationship $Vr1 \geq V1$ while $V2>Vr2$ may be satisfied.

With the above configuration, oxidation-reduction reactions selectively occur in the second metal oxide in the vicinity of the interface between the upper electrode 100c and the second metal oxide, and the resistance changing phenomenon can be achieved in a stable manner.

First, basic data concerning writing to the variable resistance nonvolatile memory element will be presented.

Figure 3:
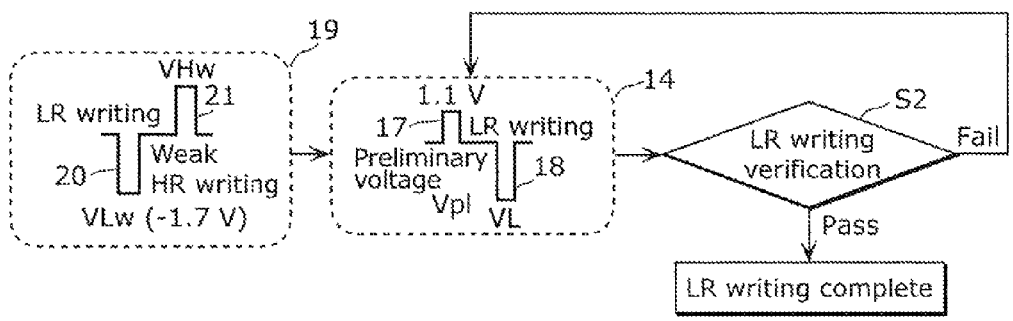
FIG. 3 is a LR writing flow chart illustrating the LR verify writing operation by way of weak HR writing for the variable resistance nonvolatile memory element according to the present invention.

FIG. 3 is a LR writing flow chart illustrating the LR verify writing operation by way of weak HR writing (in other words, low resistance writing involving verification by putting the variable resistance nonvolatile memory element into a weak HR (high resistance) state) for the variable resistance nonvolatile memory element according to the present invention. The structural elements in FIG. 3 that are the same as those in FIG. 1B are represented with the same reference signs and descriptions thereof will be omitted. The flow chart in FIG. 3 is different from the LR writing flow chart shown in FIG. 1B in that a weak HR (high resistance) writing voltage pulse set 19 is applied once before application of the LR writing voltage pulse set 14. It should be noted weak HR writing (weak high resistance writing) is writing which sets the variable resistance nonvolatile memory element in a weak HR state. The absolute value of the weak HR writing voltage may be greater than the absolute value of the HR writing threshold voltage (voltage which initiates the change from the LR state to the HR state), and may be less than the absolute value of the normal HR writing voltage.

Here, the weak HR writing voltage pulse set 19 is a voltage pulse set for weak HR writing and includes, for example, two pulses: a LR writing voltage pulse for weak HR writing 20 (LR writing voltage VLw for weak HR writing=−1.7 V, pulse width 50 ns) that is a negative voltage which applies a voltage of +1.7 V to the lower terminal 101 while a gate voltage VG=2.4 V is being applied to the gate terminal 103 of the memory cell shown in FIG. 16 (at this time a ground voltage is applied to the upper electrode terminal 102), and a weak HR writing voltage pulse 21 (weak HR writing voltage VHw=+1.6 V, pulse width 50 ns) that is a positive voltage which applies +1.6 V to the upper electrode terminal 102 while a gate voltage VG=2.4 V is being applied to the gate terminal 103 of the memory cell shown in FIG. 16 (at this time a ground voltage is applied to the lower terminal 101).

Here, the variable resistance nonvolatile memory element has the following characteristics: when a pulse of the first voltage (for example, LR writing voltage VL) is applied, the variable resistance nonvolatile memory element changes from the first resistance state (for example, high resistance state HR) used for storing the first information to the second resistance state (for example, low resistance state LR) used for storing the second information, while on the other hand, when a pulse of the second voltage (for example HR writing voltage VH) having a different polarity than the first voltage (for example, LR writing voltage VL) is applied, the variable resistance nonvolatile memory element changes from the second resistance state (for example, low resistance state LR) to the first resistance state (for example, high resistance state HR).

Here, the LR writing voltage pulse for weak HR writing 20 is a voltage pulse for first half processing (in other words, the first half of the processing for setting the variable resistance nonvolatile memory element into the second resistance state) in the weak writing step, which is one step of a two step process for changing the variable resistance nonvolatile memory element from the first resistance state to the second resistance state that includes the weak writing step and the normal writing step. The voltage of the LR writing voltage pulse for weak HR writing 20 has a voltage (the LR writing voltage VLw for weak HR writing) is a voltage (the third voltage) that has the same polarity as and different absolute value than the first voltage (here, the LR writing voltage VL). The absolute value of this third voltage (here, the LR writing voltage VLw for weak HR writing) may be less than the absolute value of the first voltage (here, the LR writing voltage VL). This is because it is possible to suppress the erase current in the weak writing step to a greater degree than the erase current in the normal writing.

Moreover, the weak HR writing voltage pulse 21 is a voltage pulse for second half processing in the weak writing step (in other words, the process of changing the variable resistance nonvolatile memory element to an intermediate resistance state having a resistance value that falls between a resistance value in the first resistance state and a resistance value in the second resistance state). The weak HR writing voltage pulse 21 has a voltage (weak HR writing voltage VHw; the fourth voltage) that has the same polarity as and, an absolute value that is less than the second voltage (for example, voltage VH). The absolute value of this fourth voltage (here, the weak HR writing voltage VHw) is less than the absolute value of the third voltage (here, the LR writing voltage VLw for weak HR writing). This is because, as previously described, the fourth voltage (here, the weak FIR writing voltage VHw) is a voltage that sets the variable resistance nonvolatile memory element into the intermediate resistance state, while the third voltage (here, the LR writing voltage VLw for weak HR writing) is a voltage that sets the variable resistance nonvolatile memory element in to the second resistance state (a stable resistance state that is not the intermediate resistance state).

Figure 4A:
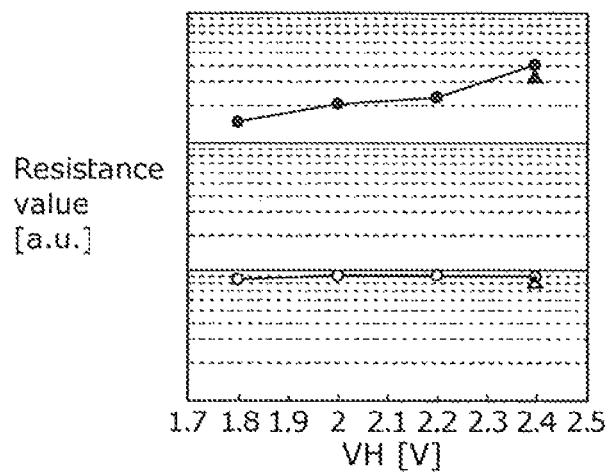
FIG. 4A illustrates the window of operation result when the LR verify writing by way of weak HR writing according to the present invention is performed.

FIG. 4A is a figure in which the average HR resistance value (black triangle) and the average LR resistance value (white triangle) when the LR verify writing via weak HR writing shown in FIG. 3 is performed are added to a characteristic diagram showing the HR writing voltage VH dependency of the average HR resistance value and the average LR resistance value similar to those in FIG. 1C. In other words, FIG. 4A is for illustrating the advantageous effects of the window of operation.

Figure 4B:
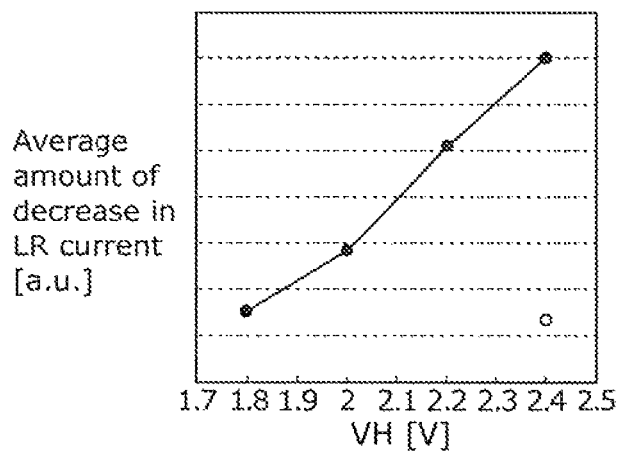
FIG. 4B illustrates the result of the improvement in LR retention characteristics when the LR verify writing by way of weak HR writing according to the present invention is performed.

FIG. 4B is a figure in which the average amount of decrease in LR current (white circle) when the LR verify writing via weak HR writing shown in FIG. 3 is performed is added to a characteristic diagram showing the HR writing voltage VH dependency of the average amount of decrease in LR current after 66 hours of retention at 150 degrees Celsius similar to FIG. 1D. In other words, FIG. 4B is for describing the advantageous effects of improvement in LR retention characteristics.

The vertical and horizontal axes of FIG. 4A and FIG. 4B are the same as in FIG. 1C and FIG. 1D, and as such, detailed descriptions thereof will be omitted.

As FIG. 4A shows, the average HR resistance value (black triangle) and the average LR resistance value (white triangle) when the LR verify writing by way of weak HR writing is performed are the same values as the result of when HR writing voltage VH is 2.4 V in FIG. 1C (the average HR resistance value and average LR resistance value of point C).

Setting the HR writing voltage VH high at 2.4 V makes it possible to increase the average HR resistance value, which it turn makes it possible to enlarge the window of operation.

Moreover, as FIG. 4B shows, the average amount of decrease in LR current (white circle) when the LR verify writing by way of weak HR writing is performed markedly improves to an average amount of decrease in LR current concurrent to when the HR writing voltage VH is 1.8 V (in other words, LR retention characteristics).

In this way, when the LR verify writing by way of weak HR writing is performed, it is possible to maintain the window of operation of the HR writing voltage VH at 2.4 V and drastically improve the retention characteristics of the LR state. Consequently, both improvement in retention characteristics and enlargement of the window of operation can be achieved.

Figure 5:
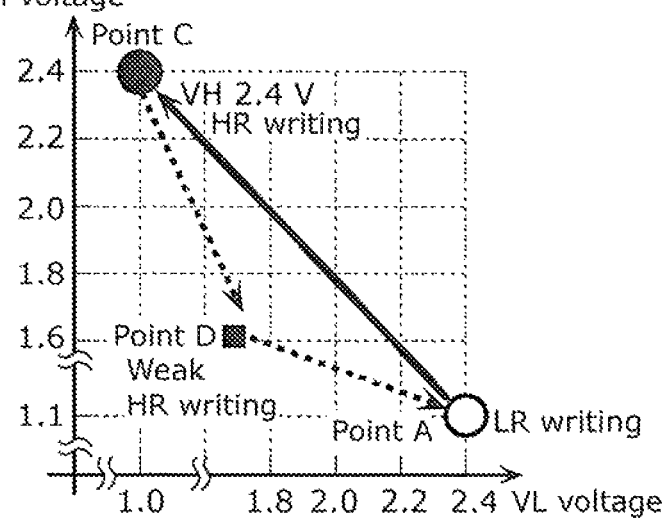
FIG. 5 is for illustrating the rewrite voltage operating point when the LR verify writing by way of weak HR writing according to the present invention is performed.

FIG. 5 is for illustrating the rewrite voltage operating point when the HR verify writing shown in FIG. 1A and the LR verify writing by way of weak HR writing shown in FIG. 3B are alternately and repeatedly performed.

The horizontal and vertical axes in FIG. 5 are the same as those in FIG. 2, and as such, descriptions thereof will be omitted. Furthermore, the structural elements in FIG. 5 that are the same as those in FIG. 2 are represented with the same reference signs and descriptions thereof will be omitted.

In FIG. 5, point D indicates an operating point for the HR state when performing weak HR writing (in other words, inducing the weak HR state) where, as the weak HR writing voltage pulse set 19, the LR writing voltage VLw for weak HR writing (for example, −1.7 V) is first applied, and then, in order to change the variable resistance nonvolatile memory element to a sufficiently low HR state, the weak HR writing voltage VHw (+1.6 V) which is sufficiently lower than the normal HR writing voltage VH (2.4 V) is applied. Afterward, for the HR state that is lower than the this sort of normal HR state (in other words, the weak HR state), the voltage balance is shifted toward the LR writing by applying the normal low resistance writing voltage pulse set 14, and the variable resistance nonvolatile memory element is changed to the LR state (operating point A) in which it is possible to improve retention characteristics.

In this way, in the HR writing, the operating point is shifted from operating point A to operating point C, that is to say, writing is performed with a sufficiently high HR writing voltage, thereby enlarging the window of operation. On the other hand, when performing LR writing, the writing voltage balance shifts toward the LR writing and LR writing performance improves, relative to when the operating point is shifted directly from operating point C to operating point A, by first changing to the weak HR state by shifting from the operating point C to the operating point D then subsequently shifting from the operating point D to the operating point A. This makes it possible to improve the retention characteristics at the same time, whereby the enlargement of the window of operation and the improvement of the LR retention characteristics can both be achieved.

1) Dependency of Retention Characteristics on Weak HR Writing Voltage VHw

Figure 6:
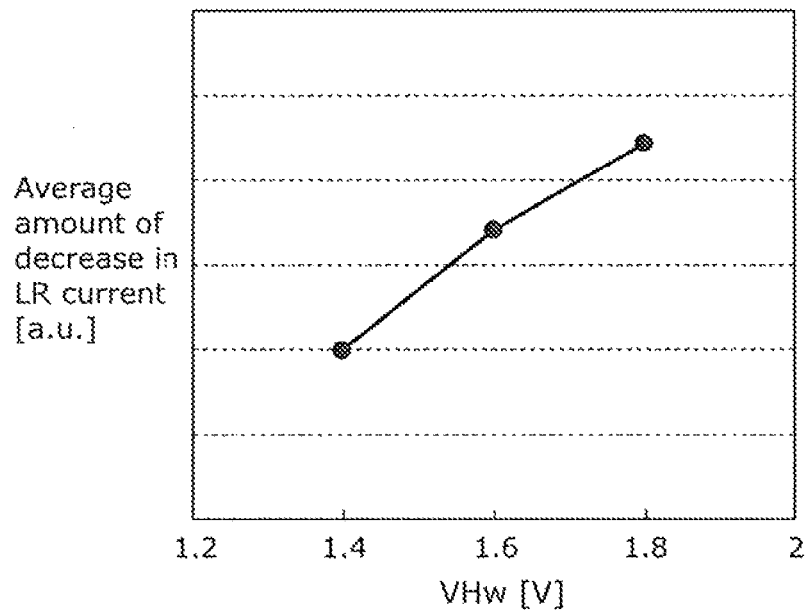
FIG. 6 is a characteristic diagram which shows the dependency of the average amount of decrease in LR current on the weak HR writing voltage VHw when the LR verify writing by way of weak HR writing according to the present invention is performed.

Next, dependency of the retention characteristics do the weak HR writing voltage VHw are shown in FIG. 6.

FIG. 6 shows the average amount of decrease in LR current when the LR verify writing by way of weak HR writing described in FIG. 3 is performed on the vertical axis and the weak HR writing voltage VHw on the horizontal axis. In other words, FIG. 6 is a characteristic diagram which shows the dependency of the average amount of decrease in LR current on the weak HR writing voltage VHw.

As FIG. 6 shows, when the weak HR writing voltage VHw is reduced to 1.4 V, in other words, when the variable resistance nonvolatile memory element is set to the LR state through an even weaker HR state, the LR retention characteristics improve more than when the weak HR writing voltage VHw is 1.6 V. On the other hand, when the weak HR writing voltage VHw is increased to 1.8 V, the advantageous effects of the LR verify writing by way of weak HR writing decrease, and the retention characteristics of the LR state begin to worsen.

In this way, the weak HR writing voltage VHw (a voltage of a voltage pulse in the low resistance writing for changing the variable resistance nonvolatile memory element to the intermediate resistance state) may be a voltage range in which it is possible to shift from the LR state to the HR state (in other words, higher than the threshold voltage which changes the variable resistance nonvolatile memory element in the LR state to the HR state) and a voltage, that is sufficiently lower than the normal HR writing voltage VH for forming the weakest HR state possible.

2) Pulse VR Characteristics

Figure 7:
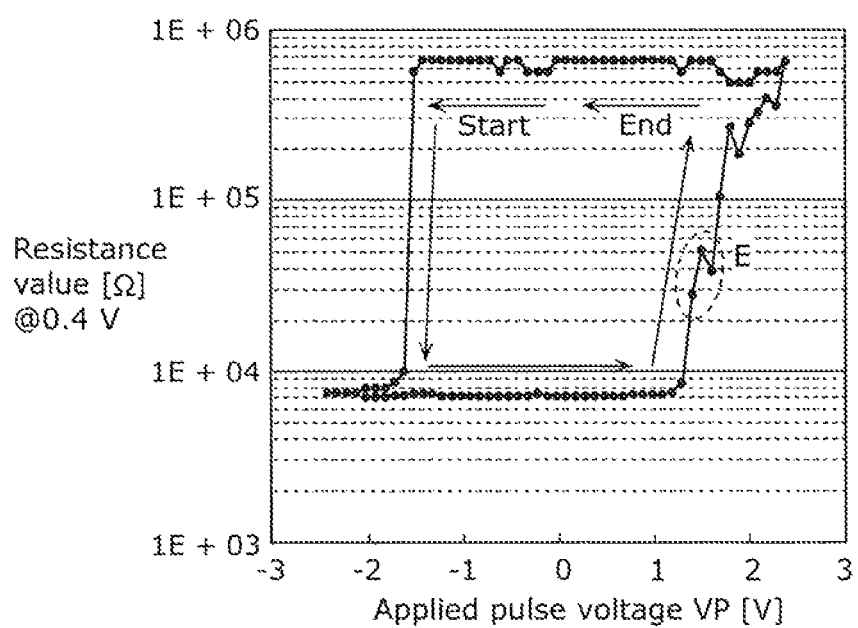
FIG. 7 shows the pulse VR characteristics of the memory cell according to the present invention.

Next, the characteristics of the pulse VR of the memory cell shown in FIG. 16 (voltage/resistance characteristics indicative of the changes in resistance value due to the application of a pulse voltage) are exemplified in FIG. 7. In FIG. 7, the horizontal axis shows the voltage VP of a pulse (pulse width 50 ns, application of voltage VG=2.4 V to the gate terminal 103) applied between the upper electrode terminal 102 and the lower terminal 101, and the vertical axis shows the resistance value of the memory cell between the upper electrode terminal 102 and the lower terminal 101 after the pulse is applied (measurement voltage is 0.4 V, application of gate voltage VG=1.8 V to the gate terminal 103). As the voltage level is gradually decreased in the direction of negative voltage from the start point (HR state) in FIG. 7, the resistance state changes from the HR state to the LR state (about 10 kΩ) when the application pulse voltage VP is −1.6 V, and as the application pulse voltage VP is further reduced, saturation occurs at −1.8 V (about 8 kΩ). This is because the absolute value of the voltage applied between the terminals of the variable resistance element 100 saturates at 1.8 V since only a voltage (1.8 V) can be supplied to the lower electrode terminal 105 equal to the gate voltage VG (2.4 V) reduced by the NMOS transistor 104 threshold voltage (about 0.6 V) due to the NMOS transistor 104 operating as a source follower. Next, as the application pulse voltage VP is increased, the resistance value of the memory cell gradually rises after 1.2 V is reached, the high resistance writing begins, and when VP is approximately from 1.4 V to 1.6 V, the resistance value changes to a weak (low) HR state (circular dotted line E: approximately 28 kΩ to approximately 51 kΩ), and furthermore, when the application pulse voltage VP is increased to 2.4 V, the resistance value reaches approximately 670 kΩ. Next, as the application pulse voltage VP is reduced, the resistance state returns to the HR state roughly the same as at the beginning of the measuring.

From the above basic data on 1) the dependency of the retention characteristics on the weak HR writing voltage VHw and 2) the pulse VP, characteristics, the following conditions may be met as the weak HR writing voltage pulse set 19 according to the present invention shown in FIG. 3.

The absolute value of the LR writing voltage VLw for weak HR writing (one example of the third voltage) must be no less than the threshold voltage (here, 1.6 V) at which resistance change from the HR state to the LR state is possible.

ii) The weak HR writing voltage VHw (one example of the fourth voltage) may be a voltage range (in other words, higher than the threshold voltage which changes the resistance state from the LR state to the HR state) in which it is possible to change the resistance state from the LR state to the HR state in order to form the weak HR state, and may be a voltage that is sufficiently lower (for example, between approximately 1.4 V and 1.6 V) than the normal HR writing voltage VH for forming a HR state that is as weak as possible. In other words, assume that the pulse VR characteristics are as follows: as the voltage applied to the variable resistance nonvolatile memory element in the LR state is gradually increased, the variable resistance nonvolatile memory element begins to change to the HR state (the resistance value increases) when the application voltage surpasses the voltage Vth, and finishes changing to the HR state when the application voltage reaches the voltage VH. In this case, the weak HR writing voltage VHw (one example of the fourth voltage) may be greater than the voltage Vth and less than the voltage VH (one example of the second voltage). Furthermore, the weak HR writing voltage VHw (one example of the fourth voltage) may be a voltage (one that is close to the voltage Vth) that is sufficiently lower than the voltage VH (one example of the second voltage).

iii) The weak HR writing voltage VHw (one example of the fourth voltage) is lower than the absolute value of the LR writing voltage VLw for weak HR writing (one example of the third voltage). Since the weak HR writing voltage VHw (one example of the fourth voltage), as described above, sets the variable resistance nonvolatile memory element into the intermediate resistance state, while the LR writing voltage VLw for weak HR writing (one example of the third voltage) sets the variable resistance nonvolatile memory element into the low resistance state (a stable resistance state that is not the intermediate resistance state), this type of relationship (the weak HR writing voltage VHw (one example of the fourth voltage) is less than the absolute value of the LR writing voltage VLw for weak HR writing (one example of the third voltage)) is made.

As described hereinbefore, the variable resistance nonvolatile memory element writing method according to the present invention is a method of writing to a variable resistance nonvolatile memory element characterized in that it changes from the first resistance state (here, the HR state) used for storing the first information to the second resistance state (here, the LR state) used for storing the second information upon application of a pulse of the first voltage (here, the LR writing voltage VL), and changes from the second resistance state (here, the LR state) to the first resistance state (here, the HR state) upon application of a pulse of the second voltage (here, the HR writing voltage VH) having a different polarity than the first voltage (here, the LR writing voltage. VL). This method of writing includes (1) the weak writing step (here, the weak HR writing), (2) the normal writing step (here, the LR writing), and (3) the verification step, as steps for changing the variable resistance nonvolatile memory element from the first resistance state (here, the HR state) to the second resistance state (here, the LR state).

Here, in the weak writing step (here, the application of the weak HR writing voltage pulse set 19), the variable resistance nonvolatile memory element is changed to the second resistance state (here, the LR state) by the LR writing voltage pulse for weak HR writing 20 and, subsequently, the variable resistance nonvolatile memory element is changed to the intermediate resistance state (here, the weak HR state) having a resistance value that falls between a resistance value of the first resistance state (here, the HR state) and a resistance value of the second resistance state (here, the LR state) by the weak HR writing voltage pulse 21.

Moreover, in the normal writing step (here, the application of the LR writing voltage pulse set 14), the preliminary voltage pulse 17 is applied to the variable resistance nonvolatile memory element (here, the variable resistance nonvolatile memory element in the weak HR state) and, subsequently, the LR writing voltage pulse 18 is applied to change the variable resistance nonvolatile memory element to the second resistance state (here, the LR state).

Moreover, in the verification step, it is verified whether the writing for the second resistance state (here, the LR state) has been completed. It should be noted the normal writing step and the verification step are repeated until it is verified in the verifying that the writing for the second resistance state (here, the LR state) has been completed.

More specifically, in the weak writing step (here, the application of the weak HR writing voltage pulse set 19), a pulse of the third voltage (here, the negative LR writing voltage VLw for weak HR writing) having the same polarity as the first voltage (here, the LR writing voltage VL) is applied to the variable resistance nonvolatile memory element, setting the variable resistance nonvolatile memory element into the second resistance state (here, the LR state), and, subsequently, a pulse of the fourth voltage (here, the weak HR writing voltage VHw) having the same polarity as and an absolute value that is less than that of the second voltage (here, the HR writing voltage VH) is applied, changing the variable resistance nonvolatile memory element to the intermediate resistance state (here, the weak HR state). At this time, the absolute value of this fourth voltage (here, the weak HR writing voltage VHw) may be greater than the absolute value of the threshold voltage (here, the HR writing threshold voltage) and less than the absolute value of the third voltage (here, the LR writing voltage VLw for weak HR writing).

Moreover, in the normal writing step (the application of the LR writing voltage pulse set 14), a pulse of the first voltage (here, the LR writing voltage VL) is applied at least once to the variable resistance nonvolatile memory element. More specifically, in the normal writing step (the application of the LR writing voltage pulse set 14), a pulse of the fifth voltage (here, the preliminary voltage Vpl) having the same polarity as the second voltage and a lower absolute value than the fourth voltage is applied to the variable resistance nonvolatile memory element and, subsequently, a pulse of the first voltage (here, the LR writing voltage VL) is applied.

This kind of writing method makes it possible to both improve the LR retention characteristics and enlarge the window of operation.

(The Variable Resistance Nonvolatile Memory Device According to an Embodiment of the Present Invention)

Based on the knowledge attained from the above-described basic data, the inventors have devised a nonvolatile memory device which implements a writing operation (in other words, the LR writing via weak HR writing) which enables the enlargement of the window of operation and the improvement of retention characteristics. Hereinafter, as an embodiment of the present invention, a 1T1R nonvolatile memory device using the variable resistance element shown in FIG. 16 will be described.

Figure 8:
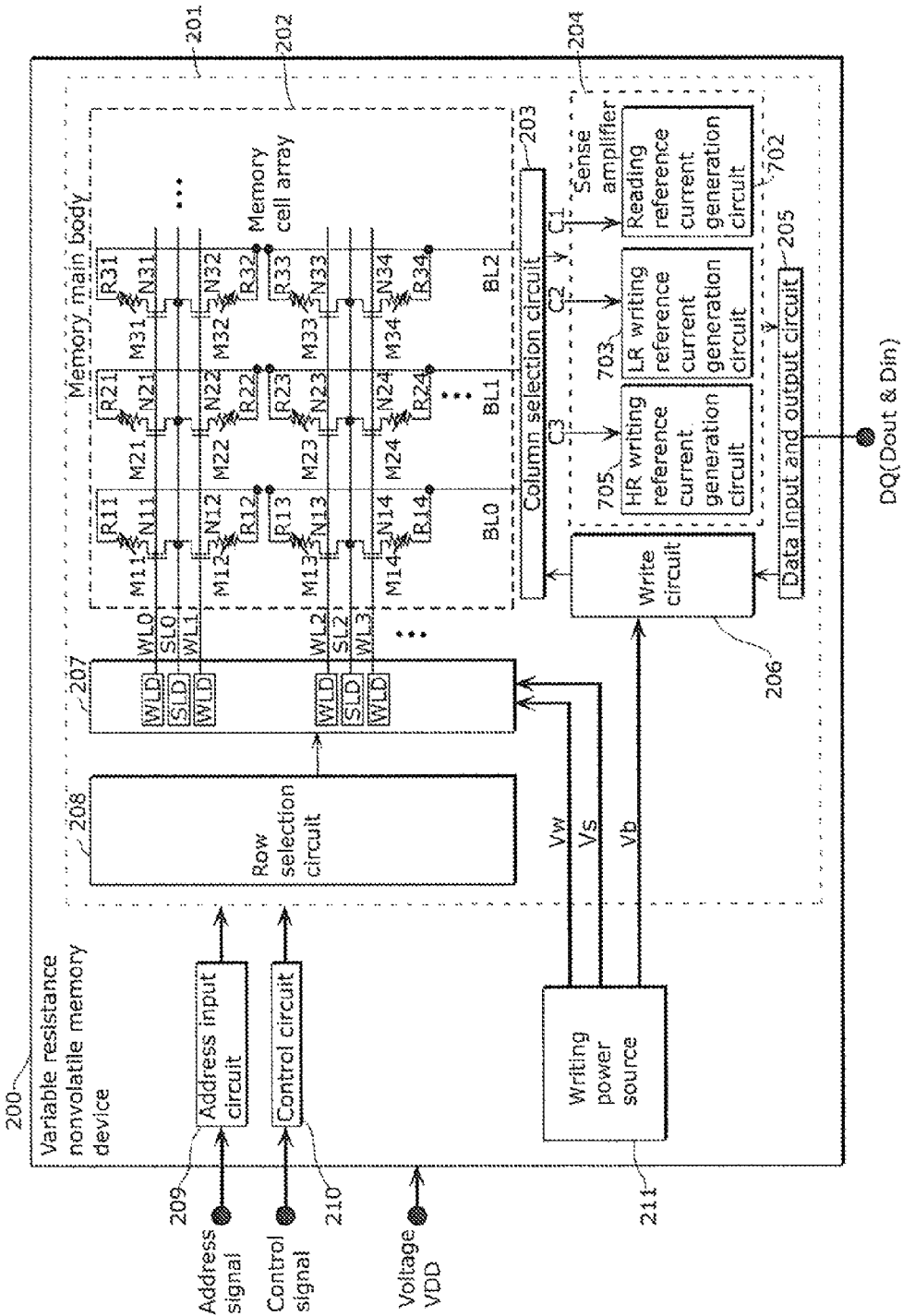
FIG. 8 shows the configuration of the variable resistance nonvolatile memory device according to an embodiment of the present invention.

FIG. 8 is a block diagram which shows the configuration of a variable resistance nonvolatile memory device 200 according to an embodiment of the present invention.

This variable resistance nonvolatile memory device 200 includes, as main structural components thereof, (1) a variable resistance nonvolatile memory element (here, the variable resistance elements R11, R12, R13, R14 . . . ) which includes a first electrode, a second electrode, and a variable resistance layer interposed between the first electrode and the second electrode, (2) a write circuit (here, the write circuit 206) which writes information into the variable resistance nonvolatile memory element, (3) a read circuit (here, the sense amplifier 204) which reads information from the variable resistance nonvolatile memory element, and (4) a control circuit (here, the control circuit 210) which controls the write circuit and the read circuit as well as verifies, after the normal writing step by the write circuit, whether the writing for the second resistance state has been completed by referring to information read by the read circuit.

The variable resistance nonvolatile memory element is included in a memory cell (here, the memory cells M11, M12 . . . ) with a selecting element (here, the NMOS transistors N11, N21, N31 . . . ) that is connected in series to the variable resistance nonvolatile memory element and switchable between a conducting state and a nonconducting state.

The write circuit (here, the write circuit 206) is a circuit for changing the variable resistance nonvolatile memory element from the first resistance state to the second resistance state and which, as described above, executes the weak writing step and, subsequently, the normal writing step.

The read circuit (here, the sense amplifier 204) is a read circuit that reads information from the variable resistance nonvolatile memory element.

The control circuit (here, the control circuit 210) is a circuit which controls the write circuit and the read circuit and verifies, after the normal writing step by the write circuit, whether the writing for the second resistance state has been completed by referring to information read by the read circuit. This control circuit controls the write circuit and the read circuit to repeat (i) the writing by the write circuit to change the variable resistance nonvolatile memory element from the first resistance state to the second resistance state and (ii) the verifying until the control circuit verifies that the writing for the second resistance state has been completed.

Hereinafter, this variable resistance nonvolatile memory device 200 will be described in detail.

As FIG. 8 shows, the variable resistance nonvolatile memory device 200 according to this embodiment includes a memory main body 201 above a semiconductor substrate. The memory main body 201 includes a memory cell array 202 configured of a plurality of the 1T1R memory cells shown in FIG. 16, a row selection circuit 208, a row driver 207 including word line drivers WLD and source line drivers SLD, a column selection circuit 203, a write circuit 206 for writing data, a sense amplifier 204 which detects an amount of current flowing in a selected bit line to verify the high resistance state as data "0" or the low resistance state as data "1", a data input and output circuit 205 which performs an input and output process of input and output data via a DQ terminal, and a writing power source 211.

Furthermore, the variable resistance nonvolatile memory device 200 includes an address input circuit 209 which receives an address signal input from an external source, and a control circuit 210 which controls operation of the memory main body 201 based on a control signal input from an external source.

The memory cell array 202 includes, formed above the semiconductor substrate: a plurality of word lines WL0, WL1, WL2, WL3 . . . , and a plurality of bit lines BL0, BL1, BL2 . . . , arranged in an array and crossing each other; a plurality of NMOS transistors N11, N12, N13, N14 . . . , N21, N22, N23, N24 . . . , N31, N32, N33, N34 (hereinafter referred to as transistors N11, N12 . . . ) each deposited to correspond to the crosspoints of the word lines WL0, WL1, WL2 . . . , and bit lines BL0, BL1, BL2 . . . ; and a plurality of variable resistance elements R11, R12, R13, R14 . . . , R21, R22, R23, R24 . . . , R31, R32, R33, R34 . . . (hereinafter referred to as variable resistance elements R11, R12 . . . ) connected in serial in a one-to-one relationship with the transistors N11, N12 . . . (the corresponding elements each form memory cells M11, M12, M13, M14 . . . , M21, M22, M23, M24 . . . , M31, M32, M33, M34 . . . (hereinafter referred to as memory cells M11, M12 . . . )).

As shown in FIG. 8, gates of the transistors N11, N21, N31 . . . are connected to the word line WL0, gates of the transistors N12, N22, N32 . . . are connected to the word line WL1, gates of the transistors N13, N23, N33 . . . are connected to the word line WL2, and gates of the transistors N14, N24, N34 . . . are connected to the word line WL3.

Moreover, the transistors N11, N21, N31 . . . and the transistors N12, N22, N32 . . . are connected in common to the source line SL0, and the transistors N13, N23, N33 . . . and the transistors N14, N24, N34 . . . are connected in common to the source line SL2. In other words, the source lines SL0, SL2 . . . are arranged parallel to the word lines WL0, WL1, WL2, WL3 . . . and arranged to cross (in this embodiment, arranged to be three-dimensionally orthogonal to) the bit lines BL0, BL1, BL2 . . . . It should be noted in the above configuration example, the source lines are arranged parallel to the word lines, but may be arranged parallel to the bit lines. Moreover, the source lines are configured such that a common voltage is applied to the transistors connected as plate lines, but a source line selection circuit/driver may be used which has the same configuration as the row selection circuit/driver, and the selected source line and the unselected source lines may be driven with different voltages (as well as polarities).

Moreover, the variable resistance elements R11, R12, R13, R14 . . . are connected to the bit line BL0, while the variable resistance elements R21, R22, R23, R24 . . . are connected to the bit line BL1, and furthermore, the variable resistance elements R31, R32, R33, R34 . . . are connected to the bit line BL2. In this way, in the memory cell array 202 according to this embodiment, the variable resistance elements R11, R21, R31 . . . are directly connected to the respective bit lines BL0, BL1, BL2 . . . , and not connected via the NMOS transistors N11, N21, N31 . . . .

In a data write cycle, the control circuit 210 outputs, to the write circuit 206, a write command signal instructing application of a voltage for writing, according to input data Din input into the data input and output circuit 205. On the other had, in a data read cycle, the control circuit 210 outputs, to the sense amplifier 204, a read command signal instructing a reading operation.

The row selection circuit 208 has the ability to select any one of the plurality of word lines WL0, WL1, WL2, WL3 . . . for specifying the memory cell to be written to or read from. For this reason, the row selection circuit 208 receives a row address signal output from the address input circuit 209, and according to the row address signal, causes a word line driver circuit WLD of the row driver 207 which corresponds to one of the word lines WL0, WL1, WL2, WL3 . . . to apply a given voltage to a selected one of the word lines.

In the same manner, the row selection circuit 208 has the ability to select any one of the plurality of source lines SL0, SL2 . . . for specifying the memory cell to be written to or read from. For this reason, the row selection circuit 208 receives a row address signal output from the address input circuit 209, and according to the row address signal, causes a source line driver circuit SLD of the row driver 207 which corresponds to one of the source lines SL0, SL2 . . . to apply a given voltage to a selected one of the source lines.

The column selection circuit 203 is a circuit which selects one of the plurality of bit lines BL0, BL1, BL2 ... to specify the memory cell to be written to or read from.

The write circuit 206 applies a write voltage to the bit line selected by the column selection circuit 203 when it receives a write signal output from the control circuit 210.

The writing power source 211 supplies a word line voltage Vw and a source line voltage Vs to the row driver 207, or supplies a bit line voltage Vb to the write circuit 206.

Figure 9:
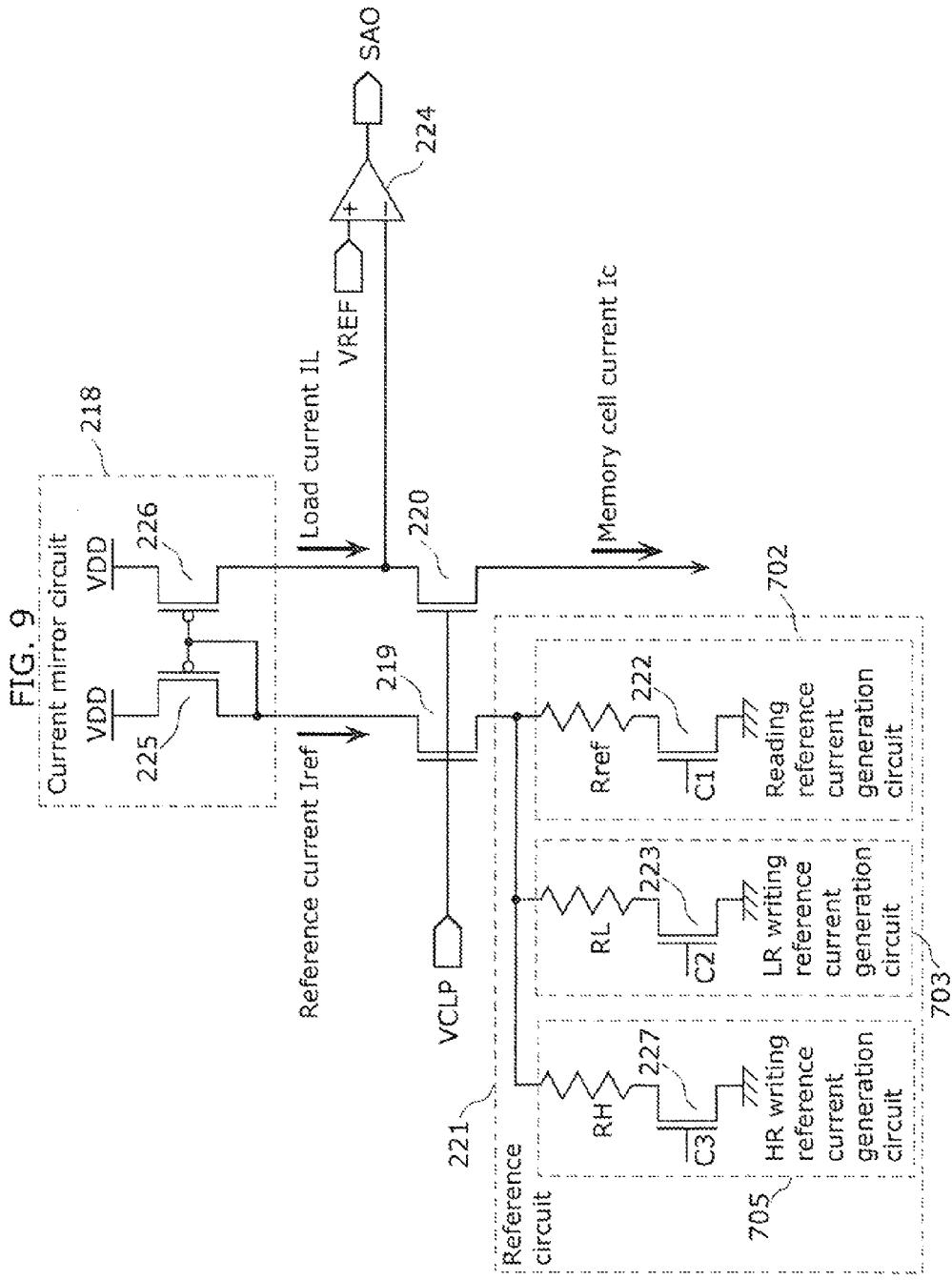
FIG. 9 shows the circuitry for an example of the configuration of the sense amplifier according to an embodiment of the present invention.

FIG. 9 is a circuit diagram showing an example of configuration of the sense amplifier 204 shown in FIG. 8 in detail.

The sense amplifier 204 includes, for example, a current mirror circuit 218 with a mirror ratio of 1:1, clamp transistors 219 and 220 of the same size, a reference circuit 221, and a differential amplifier 224. The reference circuit 221 includes a reading reference current generation circuit 702, a LR writing reference current generation circuit 703, and a HR writing reference current generation circuit 705.

In the reading reference current generation circuit 702, one terminal of a branch in which the reading reference resistance Rref and the selection transistor 222 are connected to in series is connected to a ground potential, and the other terminal is connected to the source terminal of the clamp transistor 219. Moreover, a read enable signal C1 is input into the gate terminal of the selection transistor 222, and the selection transistor 222 switches between a conducting and nonconducting state according to the read enable signal C1.

In the same manner, in the LR writing reference current generation circuit 703, one terminal of a branch in which the LR writing verify reference resistance RL (RL<Rref) and the selection transistor 223 are connected in series is connected to a ground potential, and the other terminal is connected to the source terminal of the clamp transistor 219. Moreover, a LR writing verify enable signal C2 is input into the gate terminal of the selection transistor 223, and the selection transistor 223 switches between a conducting and nonconducting state according to the LR writing verify enable signal C2.

Similarly, in the HR writing reference current generation circuit 705, one terminal of a branch in which the HR writing verify reference resistance RH (RH>Rref) and the selection transistor 227 are connected to in series is connected to a ground potential, and the other terminal is connected to the source terminal of the clamp transistor 219. Moreover, a HR writing verify enable signal C3 is input into the gate terminal of the selection transistor 227, and the selection transistor 227 switches between a conducting and nonconducting state according to the HR writing verify enable signal C3.

Moreover, a clamp voltage VCLP (VCLP<VDD) is input into the gate terminal of each of the clamp transistors 219 and 220, the source terminal of the clamp transistor 220 is connected to a memory cell via the column selection circuit 203 and a bit line, and the drain terminals of the clamp transistors 219 and 220 are connected to the respective drain terminals of the transistors 225 and 226 included in the current mirror circuit 218. A drain terminal potential of the clamp transistor 220 is compared with the reference voltage VREF (for example, 1.1 V) by the differential amplifier 224 and determined to be either greater than or less than the reference voltage VREF. The result of the determination is transmitted to the data input and output circuit 205 as a sense amplifier output SAO.

Figure 10:
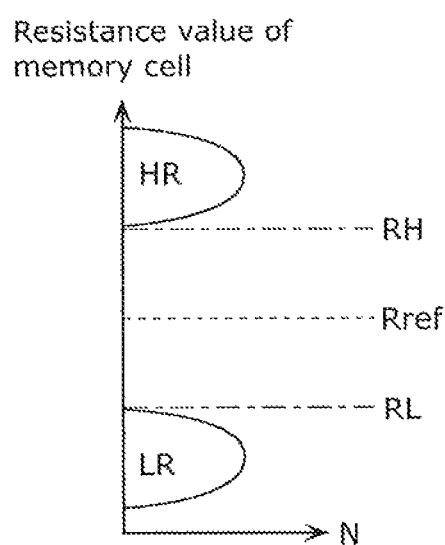
FIG. 10 is for illustrating determination levels of the sense amplifier according to an embodiment of the present invention.

FIG. 10 is a diagram for illustrating, determination levels of the sense amplifier 204. As shown in FIG. 10, the sense amplifier 204 has the following three determination levels between a resistance value of a memory cell in the HR state and a resistance value of a memory cell in the LR state: (1) reading reference resistance Rref, (2) LR writing verify reference resistance RL that is smaller than the reading reference resistance Rref (RL<Rref), and (3) HR writing verify reference resistance RH that is bigger than the reading reference resistance Rref (RL<Rref<RH).

It should be noted the LR writing verify reference resistance RL is used to verify whether the LR writing to a variable resistance element is complete or not, and the HR writing verify reference resistance RH is used to verify whether the HR writing to a variable resistance element is complete or not. Moreover, the reading reference resistance Rref is used to verify whether a variable resistance element is in the high resistance state or the low resistance state.

(Operation of the Variable Resistance Nonvolatile Memory Device According to an Embodiment of the Present Invention)

Next, regarding the variable resistance nonvolatile memory device 200 configured as described above, operations of the main circuit blocks will be described, followed by the reading and writing operations of the variable resistance nonvolatile memory device 200.

First, operations of the sense amplifier 204 shown in FIG. 9 will be described. In the LR writing process which sets the variable resistance element into the LR state, the sense amplifier 204 is connected to the target memory cell via the column selection circuit 203 and one of the bit lines after the write circuit 206 applies the weak HR writing voltage pulse set 19 followed by the LR writing voltage puke set 14 to a variable resistance element. A voltage that is higher than a voltage (VCLP−Vth) obtained by reducing a clamp voltage VCLP by a threshold voltage (Vth) of the clamp transistors 219 and 220 is not applied to the memory cell.

In contrast, in the reference circuit 221, the selection transistor 223 is activated and put in a conducting state by the LR writing verify enable signal C2, and the LR writing reference resistance RL is selected. The other selection transistors 222 and 227 are each deactivated and put in a nonconducting state by the read enable signal C1 and the HR writing verify enable signal C3, and a reference current Iref ($\approx$(VCLP−Vth)/RL) flows.

Consequently, the reference current Iref is transferred by the current mirror circuit 218 and a current (IL=Iref) that is substantially equal to Iref flows as a load current IL. The clamp transistor 220 compares the load current IL and a memory cell current Ic to determine the magnitude relationship. Depending on the comparison result, the differential amplifier 224 detects whether a drain terminal voltage of the clamp transistor 220 is higher or lower than the reference voltage VREF (for example, 1.1 V), and the differential amplifier 224 outputs the result of the detection ds a sense amplifier output SAO.

Here, when the weak HR writing voltage pulse set 19 is applied and, subsequently, the resistance value of the variable resistance element after application of the LR writing voltage pulse set 14 is RLt, the memory cell current Ic (=(VCLP−Vth)/RLt) flows. At this time, if load current IL> memory cell current Ic, then the drain terminal voltage of the clamp transistor 220 is higher than the reference voltage VREF after a given period of time, and the sense amplifier output SOA outputs L level. In other words, when the memory cell (selected memory cell) selected by the row selection circuit 208 and the column selection circuit 203 is in a resistance state that is higher than the LR writing reference resistance RL, the sense amplifier 204 outputs "0", or in other words, fails verification.

Conversely, if load current IL<memory cell current Ic, then the drain terminal voltage of the clamp transistor 220 is lower than the reference voltage VREF after a given period of time, and the sense amplifier output SOA outputs H level. In other words, when the selected memory cell is in a resistance state that is lower than the LR writing verify reference resistance RL, the sense amplifier 204 outputs "1", or in other words, passes verification, indicating that the LR writing for the target memory cell is complete.

Next, in the HR writing process, the sense amplifier 204 is connected to the target memory cell via the column selection circuit 203 and one of the bit lines after the write circuit 206 applies the HR writing voltage pulse set 13 to a variable resistance element. In the memory cell, similar to in the LR writing process, a voltage that is higher than a voltage (VCLP−Vth) obtained by reducing a clamp voltage VCLP by a threshold voltage (Vth) of the clamp transistors 219 and 220 is not applied to the memory cell.

In contrast, in the reference circuit 221, the selection transistor 227 is activated and put in a conducting state by the HR writing verify enable signal C3, and the HR writing reference resistance RH is selected. The other selection transistors 222 and 223 are deactivated and put in a nonconducting state by the read enable signal C1 and the LR writing verify enable signal C2, and a reference current Iref ($\approx$(VCLP−Vth)/RH) flows.

Consequently, the reference current Ire is transferred by the current mirror circuit 218 and a current (IL=Iref) that is substantially equal to Iref flows as a load current IL. The clamp transistor 220 compares the load current IL and a memory cell current Ic to determine the magnitude relationship.

Here, when the resistance value of the variable resistance element after application of the HR writing voltage pulse set 13 is RHt, the memory cell current Ic (=(VCLP−Vth)/RHt) flows. At this time, if load current IL<memory cell current Ic, then the drain terminal voltage of the clamp transistor 220 is lower than the reference voltage VREF after a given period of time, and the sense amplifier output SOA outputs H level. In other words, when the selected memory cell is in a resistance state that is lower than the HR writing reference resistance RH, the sense amplifier 204 outputs "1", or in other words, fails verification.

Conversely, if load current IL> memory cell current Ic, then the drain terminal voltage of the clamp transistor 220 is higher than the reference voltage VREF after a given period of time, and the sense amplifier output SOA outputs L level. In other words, when the selected memory cell is in a resistance state that is lower than the HR writing verify reference resistance RH, the sense amplifier 204 outputs "0", or in other words, passes verification, indicating that the HR writing for the target memory cell is complete.

Moreover, during the reading, in the reference circuit 221, the selection transistor 222 is activated and put in a conducting state by the read enable signal C1, and the reading reference resistance Rref is selected. The other selection transistors 223 and 227 are each deactivated and put in a nonconducting state by the rLR writing verify enable signal C2 and the HR writing verify enable signal C3, and a reference current Iref ($\approx$(VCLP−Vth)/Rref) flows.

Consequently, the reference current Iref is transferred by the current mirror circuit 218 and a current (IL=Iref) that is substantially equal to Iref flows as a load current IL. The clamp transistor 220 compares the load current IL and a memory cell current Ic to determine the magnitude relationship. Depending on the comparison result, the differential amplifier 224 (SEE 0154) detects whether a drain terminal voltage of the clamp transistor 220 is higher or lower than the reference voltage VREF, and the differential amplifier 224 outputs the sense amplifier output SAO.

Where a resistance value of the variable resistance element in the high resistance state is expressed as Rhr and a resistance value of the variable resistance element in the low resistance state is expressed as Rlr (Rhr>Rref>Rlr), when the selected memory cell is in the high resistance state, the memory cell current Ic (=(VCLP−Vth)/Rhr) flows. At this time, the load current IL> the memory cell current Ic, the drain terminal voltage of the clamp transistor 220 is higher than the reference voltage VREF, and the sense amplifier output SAO outputs L level. Stated differently, when the selected memory cell is in the high resistance state (Rhr) in which resistance is higher than the reading reference resistance Rref, the sense amplifier 204 determines "0" data.

Conversely, when the selected memory cell is in the low resistance state, the memory cell current Ic (=(VCLP−Vth)/Rlr) flows. At this time, the load current IL< the memory cell current Ic, the drain terminal voltage of the clamp transistor 220 is lower than the reference voltage VREF, and the sense amplifier output SAO outputs H level. Stated differently, when the selected memory cell is in the low resistance state (Rlr) in which resistance is lower than the reading reference resistance Rref, the sense amplifier 204 determines "1" data.

Described next, with reference to FIG. 11, are (1) voltage pulses applied to a memory cell in the low resistance (LR) writing operation, high resistance (HR) writing operation, and the reading operation, and (2) examples of voltages applied to a word line (WL), a source line (SL), and a bit line (BL) to apply these voltage pulses to the memory cell. As described below, the voltages applied to the word line (WL), the source line (SL), and the bit line (BL) are generated by the writing power source 211.

In FIG. 11, a word line voltage Vw is applied to the word line from the word line driver circuit WLD, the source line voltage Vs is applied to the source line from the source line driver circuit SLD, and the bit line voltage Vb is applied to the bit line via the write circuit 206 and the column selection circuit 203.

First, in the application of the weak HR writing voltage pulse set 19 for the LR writing operation, the bit line BL voltage in the application of the LR writing voltage pulse for weak. HR writing 20 (negative pulse) indicates a voltage pulse having an amplitude Vb (here, 1.7 V), and the bit line BL voltage in the application of the weak HR writing voltage pulse 21 (positive pulse) indicates a voltage pulse having and amplitude Vb (here, 1.6 V).

The bit line BL voltage in both the application of the positive pulse and the negative pulse in the application of the LR writing voltage pulse set 14 or the application of the HR voltage pulse set 13 for the LR writing operation indicate a voltage pulse having an amplitude Vb. Here, the amplitude of the weak HR writing voltage pulse 21 may be greater than the HR writing threshold voltage, and the amplitude of the positive pulse voltage of the LR writing voltage pulse set 14 may be less than the HR writing threshold voltage. Moreover, the amplitude of the LR writing voltage pulse for weak HR writing 20 may be less than the amplitude of the normal LR writing pulse in order to reduce erase current.

Moreover, in the reading, in the LR writing verify reading and the HR writing verify reading, a read voltage Vread is read voltage clamped by the sense amplifier 204, and corresponds to a voltage value (here, 0.4 V) adjusted so that read disturb does not occur (in other words, so that the variable resistance element does not change its resistance state). Moreover, VDD corresponds to a power supply voltage supplied to the variable resistance nonvolatile memory device 200.

Next, an example of the data read and write cycles of the variable resistance nonvolatile memory device 200 having a configuration similar to the above will be described with reference to FIG. 12A through FIG. 12D and FIG. 8 showing the variable resistance nonvolatile memory device 200 according to this embodiment of the present invention.

FIG. 12A through FIG. 12D are examples of timing charts showing an example of an operation of the variable resistance nonvolatile memory device 200 according to this embodiment of the present invention. Values used in the application examples shown in FIG. 11 are used for the voltages. It should be noted the following description is in regard to the writing and reading of data for one memory cell (for example, the memory cell M11).

Figure 12A:
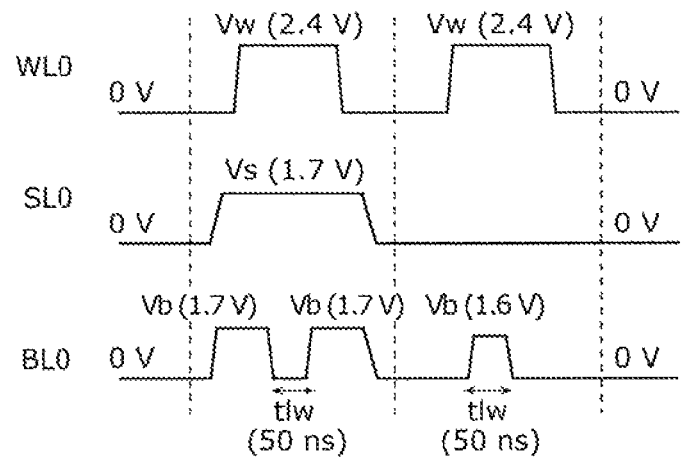
FIG. 12A shows the operation timing of the variable resistance nonvolatile memory device according to an aspect of the present invention (a timing chart for the application of the weak HR writing voltage pulse set in the LR writing).

FIG. 12A shows a timing chart for the application of the weak HR writing voltage pulse set in the LR writing for the memory cell M11. In this application of the weak HR writing voltage pulse set (in other words, in the weak writing step), the LR writing voltage pulse for weak HR writing 20 and the weak HR writing voltage pulse 21 are applied to the memory cell M11.

First, in the application cycle of the LR writing voltage pulse for weak HR writing, the selected bit line BL0 and source line SL0 are first each set to voltage 0 V. Next, the selected bit line BL0 and source line SL0 are set to the voltages Vs (here, 1.7 V) and Vb (here, 1.7 V), respectively. Next, the word line WL0 to be selected is set to the voltage Vw (here, 2.4 V), but at this time, the NMOS transistor N11 of the selected memory cell M11 in FIG. 8 is still turned OFF. At this stage, the drain terminal and the source terminal of the NMOS transistor N11 in FIG. 8 have the same potential, and irrespective of the ON/OFF state of the transistor, current is not flowing therethrough.

Next, the selected bit line BL0 is set to voltage 0 V for a time tlw (here, 50 ns), and then a pulse waveform of the voltage Vb (here, 1.7 V) is applied once again. At this stage, a negative voltage pulse of the LR writing voltage for weak HR writing (here, −1.7 V) is applied to the memory cell M11 in FIG. 8, and the resistance value of the memory cell M11 changes from a high resistance value to a low resistance value. Afterward, the word line WL0 is set to voltage 0 V, and the application of the LR writing voltage pulse for weak HR writing is complete. However, the present invention is not limited to this method.

Next, in the application cycle of the weak HR writing voltage pulse, the selected bit line BL0 and source line SL0 are first each set to voltage 0 V. Next, the word line WL0 to be selected is set to the voltage Vw (here, 2.4 V), and the NMOS transistor N11 of the selected memory cell M11 in FIG. 8 is turned ON.

Next, the selected bit line BL0 is set to voltage Vb (here 1.6 V) for a time thw, and then a pulse waveform of the voltage 0 V is applied once again. At this stage, writing is performed in which a positive voltage pulse of the weak HR writing voltage VHw (here, +1.6 V) is applied to the memory cell M11 in FIG. 8, and the resistance value of the memory cell M11 changes from the low resistance state to a weak (low) HR state (in other words, the intermediate resistance state). However, the present invention is not limited to this method.

Figure 12B:
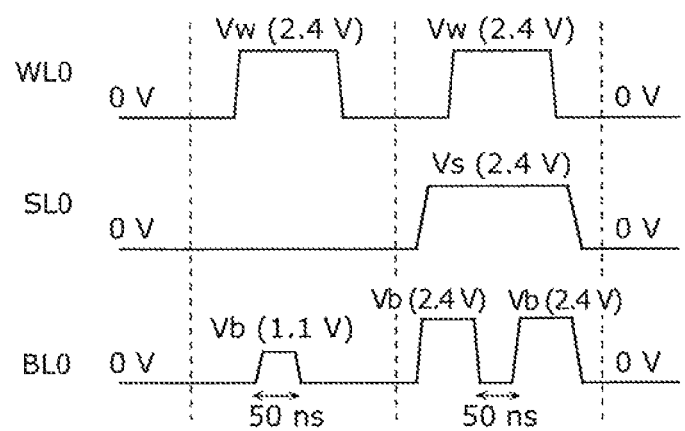
FIG. 12B shows the operation timing of the variable resistance nonvolatile memory device according to an aspect of the present invention (a timing chart for the application of the LR writing voltage pulse set in the LR writing after the application of the weak HR writing voltage pulse set).

FIG. 12B shows a timing chart for the application of the LR writing voltage pulse set (in other words, the normal writing step for LR writing) in the LR writing for the memory cell M11 after the weak HR writing voltage pulse set has been applied. In the application of this LR writing voltage pulse set, the positive voltage preliminary voltage pulse 17 and the LR writing voltage pulse 18 are applied to the memory cell M11.

The application cycle of the positive voltage preliminary voltage pulse 17 is only different in regard to the weak HR writing voltage pulse application cycle and the voltage Vb applied to the bit line, and since the same circuit operations are used, a detailed description thereof is omitted. However, even if a voltage pulse of the positive voltage preliminary voltage Vpl (here, +1.1 V) is applied to the memory cell M11 in FIG. 8, in regard to resistance value, there is no significant change, and the previous state, the weak HR state, remains as is, as the characteristics of the pulse VR in FIG. 7 infer.

The application cycle of the LR writing voltage pulse 18 which is applied next is only different in regard to the LR writing voltage pulse for weak HR writing application cycle and the voltage Vb applied to the bit line, and since the same circuit operations are used, a detailed description thereof is omitted. However, as a result of a negative voltage pulse of the LR writing voltage VL (here, −2.4 V) being applied to the memory cell M11 in FIG. 8 in the weak HR state (in other words, the intermediate resistance state), the voltage balance in regard to retention characteristics shifts toward LR writing, and the resistance value of the memory cell M11 changes to a deep, low resistance value (a LR state capable of increasing retention characteristics).

Figure 12C:
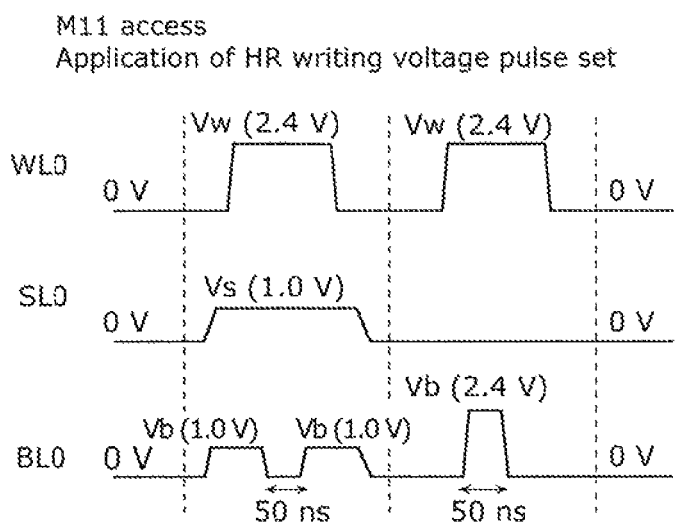
FIG. 12C shows the operation timing of the variable resistance nonvolatile memory device according to an aspect of the present invention (a timing chart for the application of the HR writing voltage pulse set).

FIG. 12C shows a timing chart for the application of the HR writing voltage pulse set for the memory cell M11. In the application of this HR writing voltage pulse set, the negative voltage preliminary voltage pulse 15 and the HR writing voltage pulse 16 are applied to the memory cell M11.

The application cycle of the negative voltage preliminary voltage pulse 15 is only different in regard to the LR writing voltage pulse for weak HR writing application cycle, the voltage Vb applied to the bit line, and the voltage Vs applied to the source line shown in FIG. 12A, and since the same circuit operations are used, a detailed description thereof is omitted. However, even if a voltage pulse of the negative voltage preliminary voltage Vph (here, −1.0 V) is applied to the memory cell M11 in FIG. 8, in regard to resistance value, there is no significant change, and the previous state, the LR state, remains as is, as the characteristics of the pulse VR in FIG. 7 infer.

The application cycle of the HR writing voltage pulse 16 which is applied next is only different in regard to the weak HR writing voltage pulse application cycle and the voltage Vb applied to the bit line, and since the same circuit operations are used, a detailed description thereof is omitted. However, as a result of a positive voltage pulse of the HR writing voltage VH (here, +2.4 V) being applied to the memory cell M11 in FIG. 8 in the LR state, the resistance value of the memory cell M11 changes to a given high resistance value.

Figure 12D:
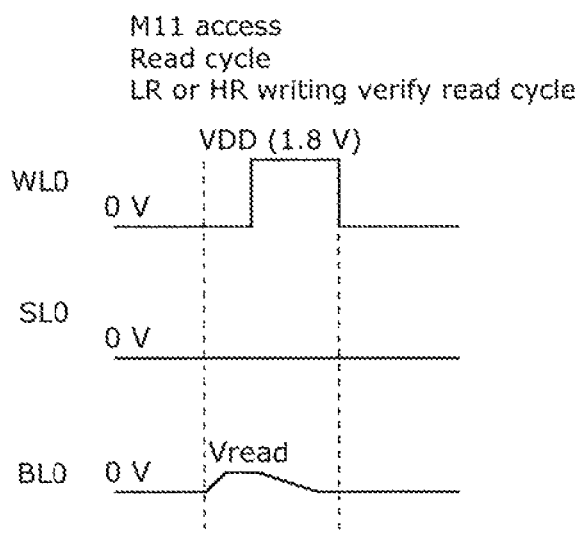
FIG. 12D shows the operation timing of the variable resistance nonvolatile memory device according to an aspect of the present invention (a timing chart for the data read cycle).

FIG. 12D is a timing chart of the data read cycle for the memory cell M11. In this read cycle, the selected bit line BL0 and source line SL0 are first set to voltage 0 V. Next, the selected bit line BL0 is precharged with the read voltage Vread.

Next, the selected work line WL 0 is set to voltage VDD (VDD>Vread), and the NMOS transistor N11 of the selected memory cell M11 is set to ON and the selected bit line BL0 is discharged. After a given period of time, the sense amplifier 204 detects the value of the current flowing through the selected memory cell M11 and determines whether the stored data is data "0" or data "1". The word line WL0 is then set to voltage 0 V, whereby the data reading operation is completed.

Regarding the reading operation, apart from the fact that the reading reference resistance Rref is used in the sense amplifier 204, the LR writing verify reference resistance RL is used in the LR writing verify reading, and the HR writing verify reference resistance RH is used in the HR writing verify reading, the reading method shown in FIG. 12d is the same as in the LR writing verify reading and in the HR writing verify reading.

Figure 13:
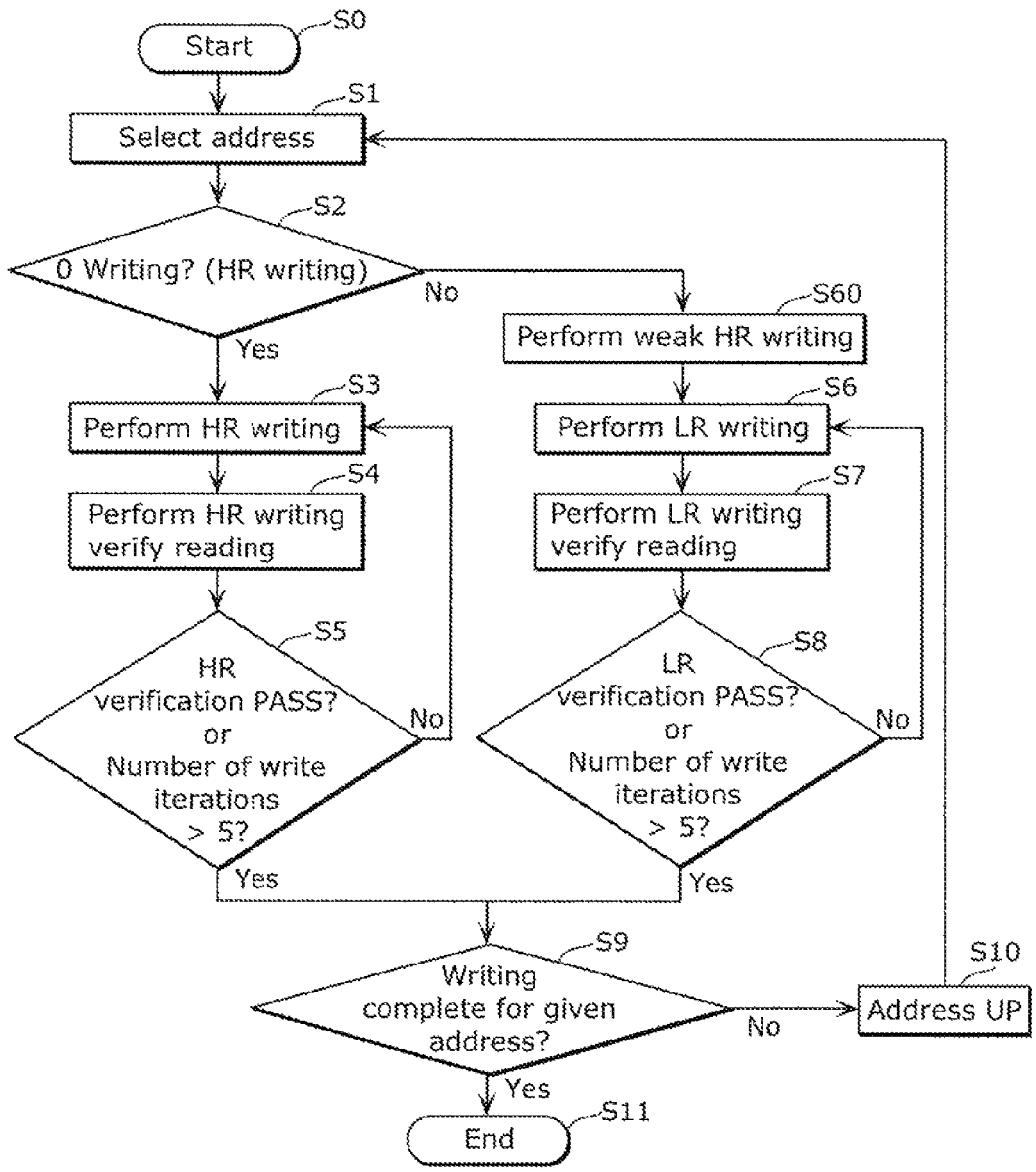
FIG. 13 is a writing flow chart for the variable resistance nonvolatile memory device according to an embodiment of the present invention.
Figure 14:
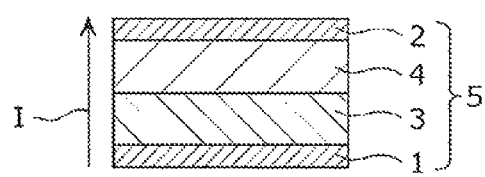
FIG. 14 is a schematic diagram of a cross section of a conventional variable resistance element.
Figure 15A:
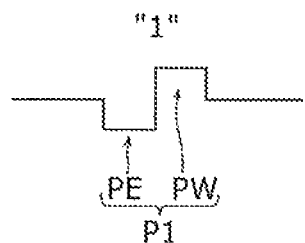
FIG. 15A shows the waveform of a pulse when writing is performed on a conventional variable resistance element.
Figure 15B:
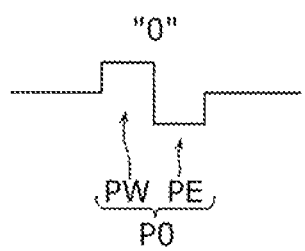
FIG. 15B shows the waveform of a pulse when erasing is performed on a conventional variable resistance element.

Next, an example of the writing operation of the variable resistance nonvolatile memory device 200 according to this embodiment will be described with reference to the flow chart shown in FIG. 13.

In 9G. 13, upon start of the writing operation (S0), the variable resistance nonvolatile memory device 200 selects an address space for an initial address of a memory cell (for example, M11) for data writing as is shown in FIG. 8 (S1). Then, in the writing for "0" data (HR writing) (yes in S2), the HR writing process which applies the HR writing voltage pulse set 13 is performed (S3), while on the other hand, in the writing for "1" data (LR writing) (no in S2), the weak HR writing process which applies the weak HR writing voltage pulse set 19 is first performed (weak writing step S60) and, subsequently, the LR writing process which applies the LR writing voltage pulse set 14 is performed (normal writing step S6). Next, the sense amplifier 204 is connected to the selected memory cell, and the HR or LR writing verify reading process is performed (verification step S4 or S7), and in the case of HR writing, the resistance value of the memory cell increases beyond the HR writing verify reference resistance RH, and the HR writing process (S3) is repeated until the verification result is PASS (no in S5), and in the case of LR writing, the resistance value of the memory cell decreases below the LR writing verify reference resistance RL, and the LR writing process (S6) is repeated until the verification result is PASS (no in S8). However, in the case of an abnormality in an operation of the memory cell, a limit for the number of additional writing iterations performed is set (here, 5 times) to keep the writing operation from continuing endlessly. If the verification results in PASS (yes in S5 or S8), the variable resistance nonvolatile memory device 200 proceeds to the next writing process address (S10) if there is a next address (no in S9), and finishes (S11) if there is no next address (yes in S9). With this kind of process flow, it is possible to, in the HR writing, write to a higher resistance state than the HR writing verify reference resistance RH, and in the LR writing, write to a lower resistance state than the LR writing verify reference resistance RL, and thereby perform writing in which a given window of operation is secured.

Here, step S4 and step S7 correspond to the timing chart shown in FIG. 12D, step S3 corresponds to the timing chart shown in FIG. 12C, step S60 corresponds to the timing chart shown in FIG. 12A, and step S6 corresponds to the timing chart shown in FIG. 12B.

In this way, in this embodiment, by implementing the LR writing via weak HR writing at the time of LR, in the HR writing, the window of operation is enlarged by writing with a sufficiently high HR writing voltage, and in the LR writing, LR writing performance is improved relatively by first changing the variable resistance nonvolatile memory element to the weak HR state, and then shifting the writing voltage balance toward the LR state in the LR writing performed thereafter. This makes it possible to improve the retention characteristics at the same time, whereby the enlargement of the window of operation and the improvement of retention characteristics can both be achieved.

The variable resistance nonvolatile memory element writing method and variable resistance nonvolatile memory device according to the present invention has been described herein based on this embodiment, but the present invention is not intended to be limited thereto.

For example, in the above embodiment, the HR writing voltage pulse set 13 and the LR writing voltage pulse set 14 each include two pulses, but the HR writing voltage pulse set 13 may include only on pulse, the HR writing voltage pulse 16, and the LR writing voltage pulse set 14 may include only one pulse, the LR writing voltage pulse 18, in order to reduce writing time and erase current.

Moreover, in the configuration of the variable resistance nonvolatile memory device 200 shown in FIG. 8, one variable resistance element is connected to the NMOS transistor, the switching element, in other words, the memory cell is a 1T1R memory cell. However, the present invention is not limited to a 1T1R memory cell. For example, a 1D1R memory cell using a bi-directional diode may be used as the switching element.

Moreover, if the configuration of or type of material used in the variable resistance element is changed, it is possible that the preferred range of the weak HR writing voltage VHw will change. However, one may research and appropriately adjust the voltage requirements to suitable values.

Moreover, in this embodiment, in the LR writing, weak HR writing is performed, but conversely, when necessary, weak LR writing may be used in the HR writing. In other words, the writing method according to the present invention (a weak writing step followed by a normal writing step) is not limited to LR writing, but may be applied to HR writing as well. In this case, the polarities of the voltages applied in each step may be reversed.

Moreover, the present invention also includes variations to the variable resistance nonvolatile memory element writing methods conceived by those skilled in the art so long as the variations do no depart from the essence of the present invention, and various variable resistance nonvolatile memory element writing methods resulting from arbitrary combinations of constituent elements of the embodiment.

INDUSTRIAL APPLICABILITY

The variable resistance nonvolatile memory element writing method and variable resistance nonvolatile memory device according to the present invention are useful in achieving a highly reliable memory which can be used in various electronic devices such as cellular phones and laptops since writing is performed within a practical voltage range in a variable resistance nonvolatile memory device having a memory cell including a switching element such as a transistor and a variable resistance element whose resistance value reversibly changes based on an electric signal, as well as because bath the window of operation of the variable resistance nonvolatile memory device can be enlarged and the retention characteristics can be improved.

REFERENCE SIGNS LIST 1, 2 electrode
3 conductive film
4 insulative film
5 variable resistance element
13 high resistance (HR) writing voltage pulse set
14 low resistance (LR) writing voltage pulse set
15 negative voltage preliminary voltage pulse
16 high resistance (HR) writing voltage pulse
17 positive voltage preliminary voltage pulse
18 low resistance (LR) writing voltage pulse
19 weak high resistance (HR) writing voltage pulse set
20 LR writing voltage pulse for weak HR writing
21 weak HR writing voltage pulse
100 variable resistance element
100a lower electrode 100b variable resistance layer
100b-1 first variable resistance layer
100b-2 second variable resistance layer
100c upper electrode
101 lower terminal
102 upper electrode terminal
103 gate terminal
104 NMOS transistor
105 lower electrode terminal
200 variable resistance nonvolatile memory device
201 memory main body
202 memory cell array
203 column selection circuit
204 sense amplifier
205 data input and output circuit
206 write circuit
207 row driver
208 row selection circuit
209 address input circuit
210 control circuit
211 writing power source
218 current mirror circuit
219, 220 clamp transistor
221 reference circuit
222, 223, 227 selection transistor
224 differential amplifier
225, 226 transistor
702 reading reference current generation circuit
703 LR writing reference current generation circuit
785 HR writing reference current generation circuit

The invention claimed is:

1. A method of writing to a variable resistance nonvolatile memory element that changes from a first resistance state for storing first information to a second resistance state for storing second information upon application of a pulse of a first voltage and changes from the second resistance state to the first resistance state upon application of a pulse of a second voltage having a polarity that is different than a polarity of the first voltage, the method of writing comprising weak writing and, subsequently, normal writing which change the variable resistance nonvolatile memory element from the first resistance state to the second resistance state, wherein in the weak writing, the variable resistance nonvolatile memory element is changed to the second resistance state by a pulse of a third voltage having a same polarity as the polarity of the first voltage and an absolute value that is different than an absolute value of the first voltage being applied to the variable resistance nonvolatile memory element and, subsequently, the variable resistance nonvolatile memory element is changed to an intermediate resistance state having a resistance value between a resistance value of the first resistance state and a resistance value of the second resistance state by a pulse of a fourth voltage having a same polarity as the polarity of the second voltage and an absolute value that is less than an absolute value of the second voltage being applied to the variable resistance nonvolatile memory element, in the normal writing, the variable resistance nonvolatile memory element is changed from the intermediate resistance state to the second resistance state by a pulse of the first voltage being applied to the variable resistance nonvolatile memory element at least once, and the absolute value of the fourth voltage is less than the absolute value of the third voltage.

2. The method of writing according to claim 1,
wherein the absolute value of the third voltage is less than the absolute value of the first voltage.

3. The method of writing according to claim 1,
wherein in the normal writing, a pulse of a fifth voltage having a same polarity as the polarity of the second voltage and an absolute value that is less than the absolute value of the fourth voltage and, subsequently, a pulse of the first voltage are applied to the variable resistance nonvolatile memory element.

4. The method of writing according to claim 1, further comprising
verifying, after the normal writing, whether writing for the second resistance state is complete,
wherein the normal writing and the verifying are repeated until it is verified in the verifying that the writing for the second resistance state is complete.

5. A variable resistance nonvolatile memory device comprising:
a variable resistance nonvolatile memory element including a first electrode, a second electrode, and a variable resistance layer interposed between the first electrode and the second electrode; and
a write circuit that writes information to the variable resistance nonvolatile memory element,
wherein the variable resistance nonvolatile memory element changes from a first resistance state for storing first information to a second resistance state for storing second information upon application of a pulse of a first voltage and changes from the second resistance state to the first resistance state upon application of a pulse of a second voltage having a polarity that is different than a polarity of the first voltage,
the write circuit performs weak writing and, subsequently, normal writing which change the variable resistance nonvolatile memory element from the first resistance state to the second resistance state,
in the weak writing, the variable resistance nonvolatile memory element is changed to the second resistance state by a pulse of a third voltage having a same polarity as the polarity of the first voltage and an absolute value that is different than an absolute value of the first voltage being applied to the variable resistance nonvolatile memory element and, subsequently, the variable resistance nonvolatile memory element is changed to an intermediate resistance state having a resistance value between a resistance value of the first resistance state and a resistance value of the second resistance state by a pulse of a fourth voltage having a same polarity as the polarity of the second voltage and an absolute value that is less than an absolute value of the second voltage being applied to the variable resistance nonvolatile memory element,
in the normal writing, the variable resistance nonvolatile memory element is changed from the intermediate resistance state to the second resistance state by a pulse of the first voltage being applied to the variable resistance nonvolatile memory element at least once, and
the absolute value of the fourth voltage is less than the absolute value of the third voltage.

6. The variable resistance nonvolatile memory device according to claim 5,
wherein the absolute value of the third voltage is less than the absolute value of the first voltage.

7. The variable resistance nonvolatile memory device according to claim 5, wherein in the normal writing, the write circuit applies a pulse of a fifth voltage having a same polarity as the polarity of the second voltage and an absolute value that is less than the absolute value of the fourth voltage and, subsequently, a pulse of the first voltage to the variable resistance nonvolatile memory element.

8. The variable resistance nonvolatile memory device according to claim 5, further comprising:
- a read circuit that reads information from the variable resistance nonvolatile memory element; and
- a control circuit that controls the write circuit and the read circuit and verifies, after the normal writing by the write circuit, whether writing for the second resistance state is complete by referring to information read by the read circuit, wherein the control circuit controls the write circuit and the read circuit to repeat (i) the writing by the write circuit to change the variable resistance nonvolatile memory element from the first resistance state to the second resistance state and (ii) the verifying until the control circuit verifies that the writing for the second resistance state is complete.

9. The variable resistance nonvolatile memory device according to claim 5,
wherein the variable resistance nonvolatile memory element is included in a memory cell with a selecting element that is connected in series to the variable resistance nonvolatile memory element and switchable between a conducting state and a nonconducting state, and
the write circuit performs the weak writing and the normal writing on the variable resistance nonvolatile memory element included in the memory cell.

10. The variable resistance nonvolatile memory device according to claim 5,
wherein the variable resistance nonvolatile memory element has a higher resistance value in the first resistance state than in the second resistance state.

* * * * *

UNITED STATES PATENT AND TRADEMARK OFFICE
CERTIFICATE OF CORRECTION

| | | |
|---|---|---|
| PATENT NO. | : 9,001,557 B2 | |
| APPLICATION NO. | : 13/990209 | |
| DATED | : April 7, 2015 | |
| INVENTOR(S) | : Ken Kawai | |

It is certified that error appears in the above-identified patent and that said Letters Patent is hereby corrected as shown below:

Title Page:
Insert item --(30)    Foreign Application Priority Data

Dec. 2, 2011    (JP) ...........................2011-265304--.

Signed and Sealed this
Twenty-ninth Day of September, 2015

Michelle K. Lee
*Director of the United States Patent and Trademark Office*